(12) United States Patent
Buatier De Mongeot et al.

(10) Patent No.: US 8,709,919 B2
(45) Date of Patent: Apr. 29, 2014

(54) METHOD FOR THE SYNTHESIS OF AN ARRAY OF METAL NANOWIRE CAPABLE OF SUPPORTING LOCALIZED PLASMON RESONANCES AND PHOTONIC DEVICE COMPRISING SAID ARRAY

(75) Inventors: Francesco Buatier De Mongeot, Genoa (IT); Corrado Boragno, Genoa (IT); Ugo Valbusa, Genoa (IT); Daniele Chiappe, Genoa (IT); Andrea Toma, Genoa (IT)

(73) Assignee: Universita' Degli Studi di Genova, Genoa (IT)

( * ) Notice: Subject to any disclaimer, the term of this patent is extended or adjusted under 35 U.S.C. 154(b) by 0 days.

(21) Appl. No.: 12/921,360

(22) PCT Filed: Mar. 6, 2009

(86) PCT No.: PCT/IB2009/050921
§ 371 (c)(1),
(2), (4) Date: Sep. 7, 2010

(87) PCT Pub. No.: WO2009/109939
PCT Pub. Date: Sep. 11, 2009

(65) Prior Publication Data
US 2011/0001119 A1 Jan. 6, 2011

(30) Foreign Application Priority Data

Mar. 7, 2008 (IT) .............................. TO2008A0175
Dec. 24, 2008 (IT) .............................. TO2008A0986

(51) Int. Cl.
*H01L 21/36* (2006.01)

(52) U.S. Cl.
USPC ........... 438/479; 438/706; 438/712; 438/720; 438/98; 257/428; 257/431; 136/256

(58) Field of Classification Search
USPC ..................... 438/461, 479; 257/431–466, 9; 977/932; 117/87
See application file for complete search history.

(56) References Cited

U.S. PATENT DOCUMENTS

2007/0289623 A1* 12/2007 Atwater ........................ 136/252
2010/0096004 A1*  4/2010 Hu et al. ....................... 136/256

OTHER PUBLICATIONS

Stepanova et al ("Self-organized Cu nanowires on glass and Si substrates from sputter etching Cu/substrate interfaces" J. Vac. Sci. Technol. B 24, 592 (published Feb. 17, 2006).*

(Continued)

*Primary Examiner* — Asok K Sarkar
*Assistant Examiner* — Dmitriy Yemelyanov
(74) *Attorney, Agent, or Firm* — Merchant & Gould P.C.

(57) ABSTRACT

A method is for the synthesis of an array of metal nanowires (w) capable of supporting localized plasmon resonances. A metal film (M) deposited on a planar substrate (D) is irradiated with a defocused beam of noble gas ions (IB) under high vacuum, so that, with increasing ion doses a corrugation is produced on the metal film surface, formed by a mutually parallel nanoscale self-organized corrugations (r). Subsequently, the height of the self-organized corrugations peaks is increased relative to the valleys (t) interposed therebetween. Then the whole the metal film is eroded so as to expose the substrate at the valleys, and to mutually disconnect the self-organized corrugations, thereby generating the array of metal nanowires. Finally, the transversal cross-section of the nanowires is reduced in a controlled manner so as to adjust the localized plasmon resonances wavelength which can be associated thereto. The nanowires array constitutes an electrode of an improved photonic device.

11 Claims, 19 Drawing Sheets

(56) References Cited

OTHER PUBLICATIONS

Toma et al. ("Self-organized metal nanowire arrays with tunable optical anisotropy", Appl. Phys. Lett. 93, 163104 (2008)).*

Precision Glass and Optics 0211 Glass Wafer Data Sheet.*

Moroni, R. et al. Uniaxial Magnetic Anisotrophy in Nanostructured Co/Cu(001): From Surface Ripples to Nanowires, Physical Review Letters, vol. 91, No. 16, Oct. 17, 2003, pp. 167207-1-167207-4.

Zhang, K. et al. "Ion induced nanoscale ripples on ferromagnetic films with correlated magnetic texture", New Journal of Physics, vol. 9, No. 2, Feb. 1, 2007, pp. 1-12.

Zgirski, M. et al. "Ion beam shaping and downsizing of nanostructures", Nanotechnology, vol. 19, No. 5, Feb. 6, 2008, pp. 1-6.

Lei, Y. et al. "Highly ordered nanostructures with tunable size, shape and properties: A new way to surface nano-patterning using ultra-thin alumina masks", Progress in Materials Science, vol. 52, No. 4, Feb. 28, 2007, pp. 465-539.

Zhao, G. et al. "Fabrication of Nanowires on InP(100) by $Ar^+$ Irradiation", International Conference on Indium Phosphide and Related Materials, Glasgow, Scotland, May 8-12, 2005.

Schaadt, D. et al. "Enhanced semiconductor optical absorption via surface Plasmon excitation in metal nanoparticles", Applied Physics Letters, vol. 86, No. 6, Feb. 2, 2005, pp. 63106-1-63106-3.

Bohren, C. et al. "Absorption and Scattering of Light by Small Particles", Wiley-Interscience Publication, John Wiley & Sons, New York 1983, Preface, Table of Contents, Introduction included.

Simon, H. et al. Optical Second-Harmonic Generation with Surface Plasmons in Silver Films', Physical Review Letters, vol. 33, No. 26, Dec. 23, 1974, pp. 1531-1534.

Nie, S. et al. "Probing Single Molecules and Single Nanoparticles by Surface-Enhanced Raman Scattering", Science, vol. 275, Feb. 21, 1997, pp. 1102-1106.

Bharadwaj, P. et al. "Nanoplasmonic enhancement of single-molecule fluorescence", Nanotechnology, vol. 18, 2007, pp. 1-5.

Wiley, B. et al. "Maneuvering the Surface Plasmon Resonance of Silver Nanostructures through Shape-Controlled Synthesis", J. Phys. Chem. B., vol. 110, 2006, 15666-15675.

Murphy, C. et al. "Surfactant-Directed Synthesis and Optical Properties of One-Dimensional Plasmonic Metallic Nanostructures", MRS Bulletin, vol. 30, May 2005, pp. 349-355.

Gole, A. et al. "Immobilization of Gold Nonorods onto Acid-Terminated Self-Assembled Monolayers via Electrostatic Interactions", Langmuir, vol. 20, 2004, pp. 7117-7122.

Oates, T. et al. "Aligned Silver Nanoparticles on Rippled Silicon Templates Exhibiting Anisotropic Plasmon Absorption", Plasmonics 2, vol. 47, 2007.

Fort, E. et al. "Dichroic Thin Films of Silver Nanoparticle Chain Arrays on Facetted Alumina Templates", Nano Letters, vol. 3, No. 1, 2003, pp. 65-67.

Kitahara, T. et al. "Optical second-harmonic spectroscopy of Au nanowire", Journal of Applied Physics, vol. 95, No. 9, May 1, 2004, pp. 5002-5005.

Rusponi, S. et al. "Ripple Structure on Ag(110) Surface Induced by Ion Sputtering", Physical Review Letters, vol. 78, No. 14, Apr. 7, 1997, pp. 2795-2798.

Rusponi, S. et al. "Patterning a surface on the nanometric scale by ion sputtering", Applied Physics Letters, vol. 75, No. 21, Nov. 22, 1999, pp. 3318-3320.

Valbusa, U. et al. "Nanostructuring surfaces by ion sputtering", Journal of Physics: Condensed Matter, vol. 14, 2002, pp. 8153-8175.

Bradley, R. et al. "Theory of ripple topography induced by ion bombardment", J. Vac. Sci. Tehnol. A., vol. 6, No. 4, Jul./Aug. 1988, pp. 2390-2395.

Bisio, F. et al. "Isolating the Step Contribution to the Uniaxial Magnetic Anisotropy in Nanostructured Fe/Ag(001) Films", Physical Review Letters, vol. 96, Feb. 10, 2006, pp. 57204-1-57204-4.

Cole, J. et al. "Optimized plasmonic nanoparticle distributions for solar spectrum harvesting", Applied Physics Letters, vol. 89, 2006, pp. 153120-1-153120-3.

Fortunato, E. et al. "Transparent conducting Oxides for Photovoltaics", MRS Bulletin, vol. 32, Mar. 2007, pp. 242-247.

O'Connor, B. et al. "Transparent and conductive electrodes based on unpatterned, thin metal films", Applied Physics Letters, vol. 93, 2008, pp. 223304-1-223304-3.

Reilly, T. et al. "Surface-plasmon enhanced transparent electrodes in organic photovoltaics", Applied Physics Letters, vol. 92, 2008, pp. 243304-1-243304-3.

Malynych, S. et al. "Light-Induced Coherent Interactions between Silver Nanoparticles in Two-Dimensional Arrays", J. Am. Chem. Soc., vol. 125, 2003, pp. 2896-2898.

Maier, S. et al. "Local detection of electromagnetic energy transport below the diffraction limit in metal nanoparticle plasmon waveguides", Nature Materials, vol. 2, Apr. 2003, pp. 229-232.

Sekiba et al., Fabrication of stable nanopatterns on metals, Applied Physics Letters, vol. 81, No. 14, Sep. 30, 2002.

Valbusa et al., Nanostructuring surfaces by ion sputtering, Institute of Physics Publishing, Journal of Physics Condensed Matter 14 (2002) 8153-8175.

* cited by examiner

METHOD FOR THE SYNTHESIS OF AN ARRAY OF METAL NANOWIRE CAPABLE OF SUPPORTING LOCALIZED PLASMON RESONANCES AND PHOTONIC DEVICE COMPRISING SAID ARRAY

This application is a National Stage Application of PCT/IB2009/050921, filed 6 Mar. 2009, which claims benefit of Serial No. TO2008A000175, filed 7 Mar. 2008 in Italy and Serial No. TO2008A000986, filed 24 Dec. 2008 in Italy and which applications are incorporated herein by reference. To the extent appropriate, a claim of priority is made to each of the above disclosed applications.

FIELD OF THE INVENTION

The present invention relates to a method for the synthesis of an array of metal nanowires capable of supporting localized plasmon resonances.

BACKGROUND OF THE INVENTION

As it is known, materials reduced to a nanometric scale show a modification of the physical-chemical properties and functionality thereof. Among the other functional properties, the optical absorption of the metal nanoparticles or nanostructures is affected by the excitation of localized surface plasmon resonances (LSPRs) of the conduction electrons excited by the electromagnetic field of light. By modifying the nanostructure shape and symmetry, it is possible to adjust the surface plasmon frequency. In the proximity of the metal nanostructures, due to their small curvature radius, it is further noticed a strong amplification of the field [C. F. Bohren and D. R. Huffman, Absorption and Scattering of light by Small Particles, New York: John Wiley and Sons, Inc. (1983)].

The production of arrays of finely spaced metal nanostructures capable of supporting plasmon resonances is of interest in applications where high field amplification effects are required, such as second harmonic generation [H. J. Simon, D. E. Mitchell, J. G. Watson, Phys. Rev. Lett. 7, 385 (1985)], surface-enhanced Raman scattering [S. M. Nie, S. R. Emery, Science 275, 1102 (1997)] or fluorescence amplification by metal nanostructures [P. Bharadwaj, P. Anger, L. Novotny, Nanotechnology 18, 044017 (2007)].

Furthermore, the production of arrays of finely spaced metal nanostructures on transparent dielectric substrates capable of supporting plasmon resonances is of interest in advanced photovoltaic applications. It has been shown that the introduction of metal nanostructures capable of supporting plasmon resonances at the interface of a photovoltaic element p-n junction involves the amplification of the conversion efficiency [D. M. Schaadt, B. Feng, and E. T. Yu, Applied Physics Letters 86, 063106 (2005)].

Processes for the formation of metal nanowires and nanorods by controlled chemical synthesis are well documented in the scientific literature. The nanostructures show optical properties which are adjustable by modifying their plasmon absorption [B. J. Wiley, S. H. Im, Z. Li, J. McLellan, A. Siekkinen, Y. Xia, J. Phys. Chem. B 110, 15666-15675 (2006)].

In order to exploit their optical/plasmon properties, the metal nanowires have to be supported on a substrate, while maintaining the morphological, structural, and chemical integrity thereof. This is a critical aspect when using approaches of a chemical type [Catherine J. Murphy, Tapan K. Sau, Anand Gole, and Christopher J. Orendorff, MRS Bulletin 30, 349 (2005)]. There are significant problems related to the fixing of the nanostructures on a substrate, the alignment thereof, and the formation of nanowire arrays with a controllable lateral separation [Anand Gole, Christopher J. Orendorff, and Catherine J. Murphy, Langmuir 2004, 20, 7117-7122]. Further drawbacks of the chemical-type approaches relate to the use of toxic chemicals.

Instead, the physical-type approaches to the synthesis of nanowire arrays based on templates (pre-structured substrates) manufactured by lithography (for example, focused electron beam or ion beam lithography) have a low throughput. In fact, the lithographic processes involve a long sequence of processing steps. There are also technical limitations regarding the substrates which can be employed in such processes, when considering the constraints given by thermal stability, vacuum, and chemistry of the substrate and film.

The physical approaches of the self-organized (or self-ordered) type are actively studied as a low cost alternative for the large scale production and on large areas of arrays of dimensionally selected and laterally ordered metal nanostructures.

The present invention develops in the field of such alternative approaches based on physical synthesis, which involve the use of equipment generally used in the microelectronics and coating (thin film depositions) industry, and particularly the use of ion beams under vacuum conditions.

In an example, [Thomas W. H. Oates, Adrian Keller, Stefan Facsko, Arndt Mücklich, Plasmonics 2, 47 (2007)] a ion beam process is employed to manufacture a nanostructured Si template (with nanoscale corrugations). The successive deposition of Au on the template, followed by high temperature annealing, causes the agglomeration of Au into nanometric scale approximately spherical aggregates which are laterally aligned in the Si valleys. The array of aligned nanoparticles shows weakly anisotropic optical and plasmon properties. Such approach, however, cannot be applied to substrates susceptible to damage by ion irradiation or thermal annealing.

In a second example, [E. Fort, C. Ricolleau, J. Sau-Pueyo, Nanoletters, 3, 65-67 (2003)], Ag nanoparticles are arranged by forming chains in the valleys of an alumina faceted template, by thermally-induced agglomeration. The anisotropic distribution of the particles involves a dichroic optical absorbance. Such approach has a limited use, since it cannot be applied to substrates susceptible to damage by the extreme thermal annealing cycles necessary for the production of the template; furthermore, the choice of the materials exhibiting a regular faceting is limited (substantially, they are those substrates corresponding to the polar termini of crystalline materials with ionic linkage).

In a third example, [T. Kitahara, A. Sugawara, H. Sano, G. Mizutani, J. Applied Physics 95, 5002 (2004)] Au nanowires are prepared by shadow deposition (grazing-angle evaporation) on faceted NaCl substrates. The Au nanowires induce a polarized excitation of second-harmonic signals. Said approach also finds a limited use, since it cannot be applied to substrates susceptible to damage by the high temperature annealing cycles necessary for the production of the template; furthermore, the choice of the materials exhibiting a regular faceting is limited (see above).

The ion irradiation-induced self-organization processes have been the subject matter of investigation by the inventors. It is known that ion irradiation induces a morphological instability also on monocrystalline metal substrates. Recently, the inventors demonstrated that it is possible to obtain nanometric scale periodic patterns on the surface of monocrystalline metals grown in a self-organized manner by controlled irradiation with a defocused beam of noble gas ions, according to a technique hereinafter referred to as ion beam sputtering (IBS) [S. Rusponi, C. Boragno, and U. Valbusa, Phys. Rev. Lett. 78, 2795 (1997)] [S. Rusponi, G. Costantini, F. Buatier de Mongeot, C. Boragno, U. Valbusa, Appl. Phys. Lett. 75, 3318 (1999); U. Valbusa, C. Boragno and F. Buatier de Mongeot, J. Phys.: Condens. Matter 14 (2002) 8153-8175]. In brief, a defocused ion beam destabilizes an otherwise planar surface, dislocating mobile adatoms and vacancies, which rearrange by thermally-activated diffusion, producing an array of periodic nanostructures (corrugations, pyramids) which choose a preferential periodicity (in the range of 10 nm-200 nm). The periodicity and the orientation of the nanostructures is determined by the competition of a levelling term (thermally-activated diffusion) and a corrugating term, due to the erosive action of the ion beam. By acting on energy of the ions, ion flow, ion dose, incidence angle, and temperature of the substrate, it is possible to modify the morphological parameters of the nanostructures (lateral periodicity, slope of the facets, orientation) [R. M. Bradley and J. M. Harper, J. Vac. Sci. Technol. A 6, 2390 (1988)].

Furthermore, the inventors reported the possibility to extend the IBS to epitaxial crystalline films of ferromagnetic material (Co or Fe) supported on a monocrystalline substrate [R. Moroni, D. Sekiba, F. Buatier de Mongeot, G. Gonella, C. Boragno, L. Mattera, U. Valbusa Physical Review Letters 91, 167207 (2003); F. Bisio, R. Moroni, F. Buatier de Mongeot, M. Canepa and L. Mattera, Physical Review Letters 96, 057204 (2006)]. In these examples, the planar interface of the ferromagnetic film is modified by IBS into a corrugated surface. The magnetic anisotropy of the nanostructured film is obtained in accordance with the morphology of the nanostructured film.

Therefore, object of the present invention is to implement a method for the synthesis of an array of metal nanowires adapted to support localized plasmon resonances, which requires the use of general use and low cost pieces of equipment, and which allows a high yield on large areas, having the feature to allow using low cost support dielectric substrates such as amorphous materials (glasses) or polymeric films.

SUMMARY OF THE INVENTION

Said object is achieved according to the invention by a method for the synthesis of an array of metal nanowires adapted to support localized plasmon resonances, comprising the following steps:
a) arranging a planar substrate of dielectric material;
b) depositing a polycrystalline metal film on the substrate; and
c) irradiating the metal film with a defocused beam of noble gas ions under high vacuum, so that, with increasing accumulated ion doses:
c1) a corrugation is produced on the surface of the metal film, formed by a plurality of mutually parallel nanoscale self-organized corrugations;
c2) subsequently, the height of the peaks of the self-organized corrugations is increased relative to the valleys interposed therebetween;
c3) then, the whole the metal film is eroded so as to expose the substrate at the valleys and to mutually disconnect the self-organized corrugations, thereby generating said array of metal nanowires; and
c4) optionally, the transversal cross-section of the nanowires is reduced in a controlled manner, so as to adjust the wavelength of the localized plasmon resonances which can be associated thereto, wherein, during ion irradiation, the metal film and substrate temperature is controlled so as to be kept below a level so as to prevent the corrugations or nanowires from decaying by diffusive relaxation.

The inventors demonstrated that the IBS technique can be extended to a class of systems which is important in many technological applications, and particularly to polycrystalline metal films supported on transparent dielectric substrates. In a first stage of the process, the surface of the polycrystalline film is nanostructured in a regular array of corrugations; with the progress of the erosion, the pattern of corrugations disconnects in an array of laterally ordered nanowires.

The method proposed according to the invention provides a low cost, high throughput technique for the synthesis of large areas of arrays of metal nanowires supported on dielectric substrates. The arrays of nanowires are aligned, and have a lateral periodicity of the order of the 100 nm. The method according to the invention is self-organized, therefore it does not require the use of lithographic masks or chemical processing operations.

The above-mentioned technique allows producing arrays of metal nanowires which exhibit a dichroic absorption tunable in the field of the visible spectrum (and optionally infrared), due to the excitation of the localized plasmon resonances.

BRIEF DESCRIPTION OF THE DRAWINGS

Further characteristics and advantages will result from the following description, with particular reference to the annexed drawings, given by way of non-limiting example only, in which.

DETAILED DESCRIPTION

The methods herein described relate to nanotechnologies. Nanotechnologies cover several fields, including nanoengineering, which can be considered as the nanoscale application of engineering. Nanoscale engineering can produce structures from atomic dimensions to structures on a higher scale, having microscopic dimensions. Therefore, nanoscale engineering can produce nanostructures. Typically, the nanostructures are devices having at least two dimensions below 1 μm (for example, nanometric dimensions). Although the specific boundaries of the class of nanostructures are not defined by a particular dimensional numeric value, the term came to indicate a class clearly recognized by those of ordinary skill in the art.

The term "nanowire" used herein relates to a nanostructure having a main axis which is longer than the other two main axes. Short nanowires, sometimes referred to as "nanorods", typically have an aspect ratio ranging between 1.5 and about 10. Longer nanowires can have an aspect ratio above 10, or also above 10000. A nanowire diameter is typically below about 500 nm, and it can be below 200 nm. In some cases, a nanowire diameter can also be below 5 nm. A nanowire length can be above about 100 nm, and it can also be up to about 1000 nm.

The "aspect ratio" is given by the length of a first axis of a nanostructure divided by the average of the lengths of the second and third axes of the nanostructure, in which the second and third axes have approximately equal lengths. Consequently, the aspect ratio for a perfect cylindrical rod would be given by the length of the long axis thereof, divided by the diameter of a transversal cross-section perpendicular to the long axis.

Figure 1:
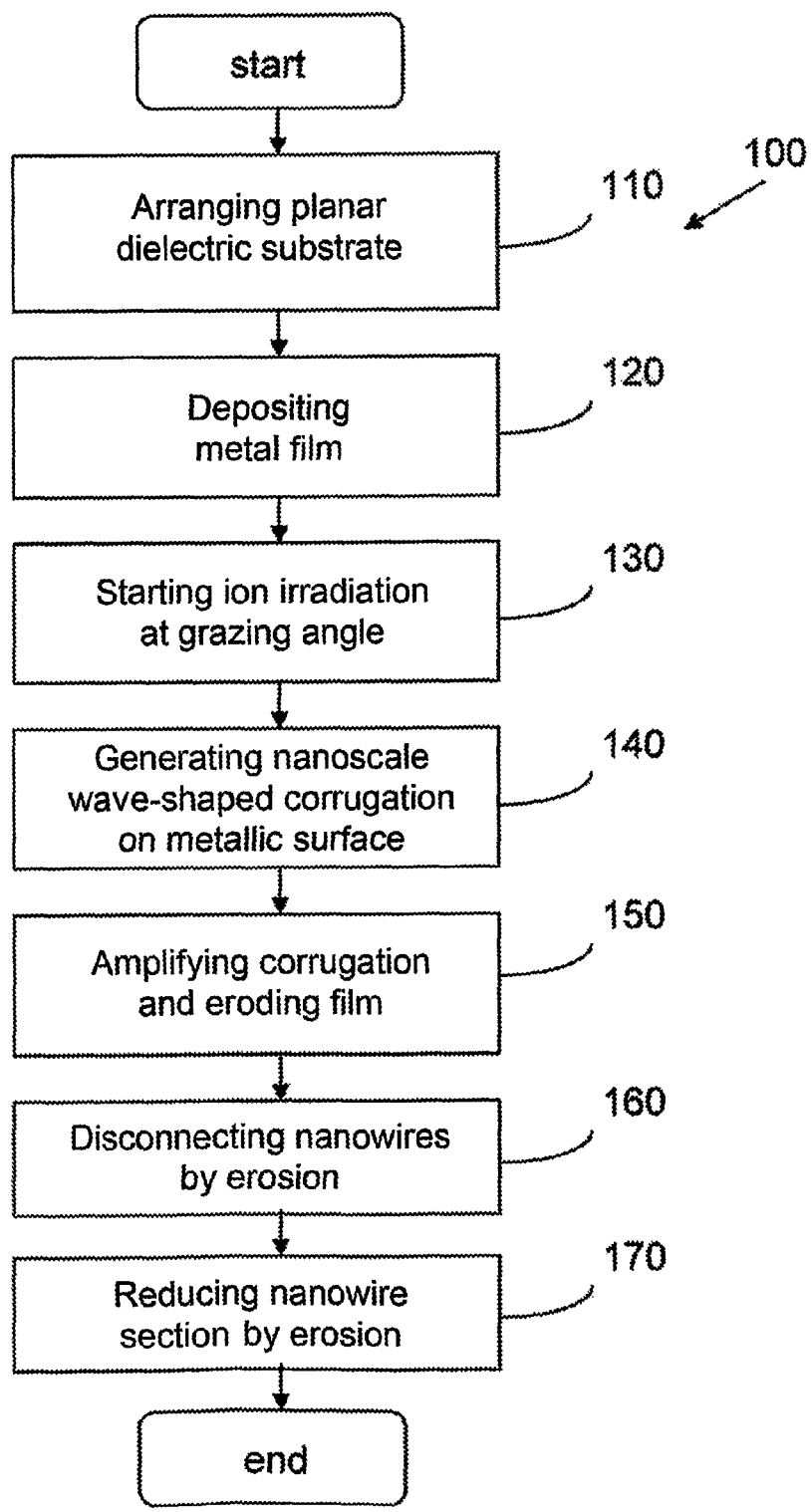
FIG. 1 is a block diagram illustrating the basic steps of a method according to the invention.
Figure 2:
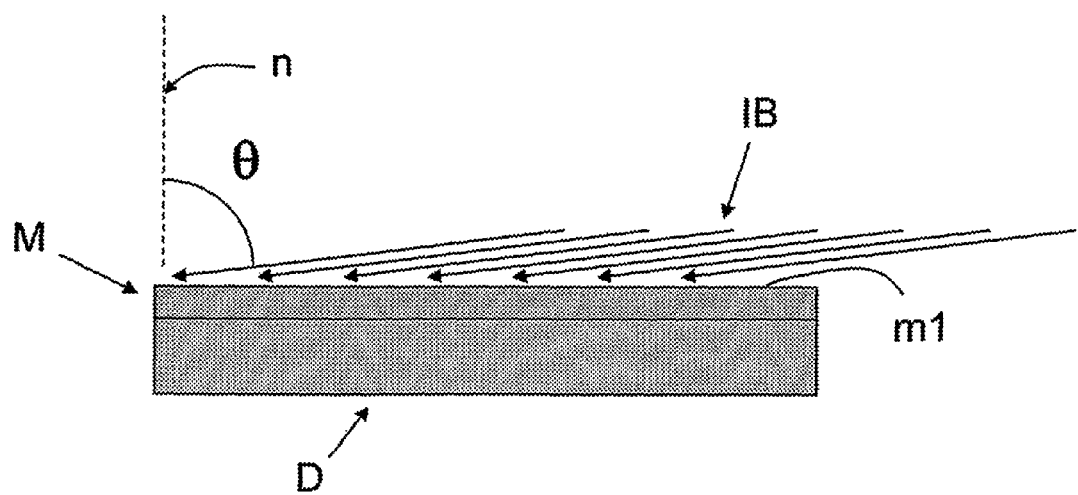
FIG. 2 is a schematic side view representing the conditions of ion beam sputtering, taken in a plane parallel to the scattering plane of the ion beam.
Figure 3:
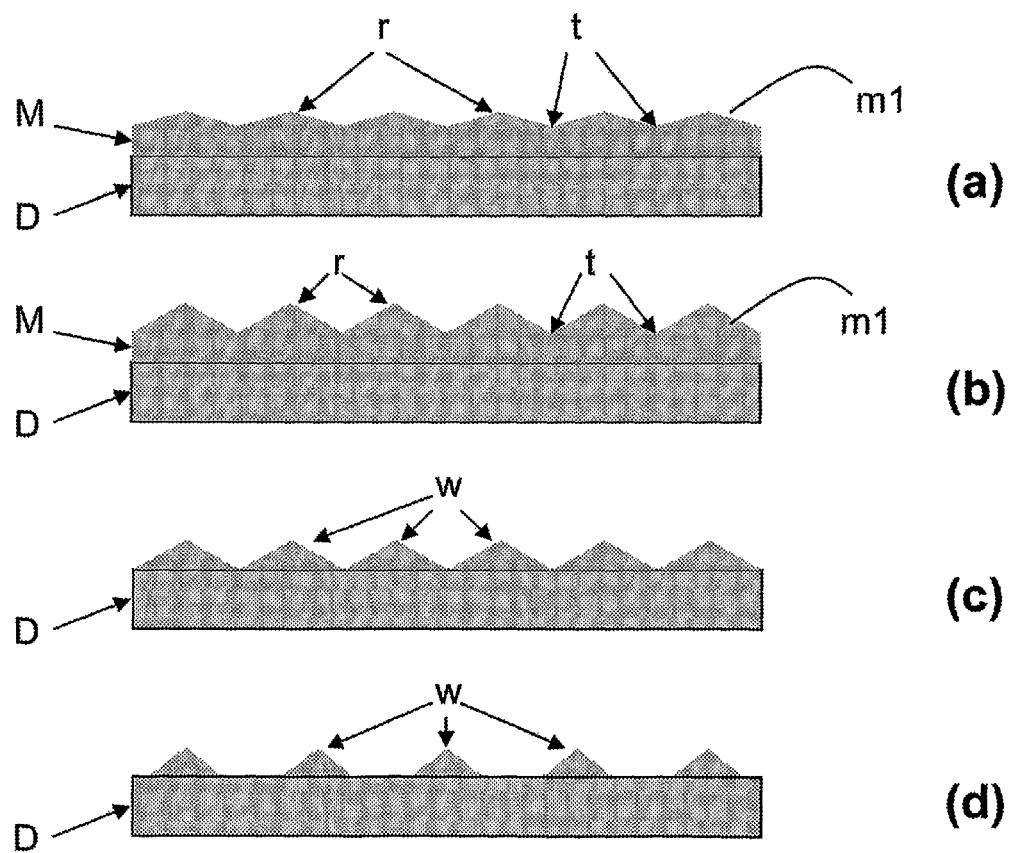
FIGS. 3(a)-3(d) are schematic, cross-sectional views representing some basic steps of the method of FIG. 1, taken in a plane orthogonal to the scattering plane of the ion beam.

FIG. 1 illustrates, by a flow chart, an example of a method for the synthesis of an array of metal nanowires capable of supporting plasmon resonances, the implementation conditions and the fundamental steps of which being represented in FIGS. 2 and 3. The array is fabricated on a planar dielectric substrate.

In a first step 110, the method provides for arranging a planar substrate D of dielectric material.

The term "substrate", as used herein, relates to a material having a "smooth" solid surface, acting as a support for a film of a different material, grown on top of the substrate. In this context, the substrate can be a single crystal (that is, a material featuring a long range order of the structure thereof along the entire extent thereof), a polycrystalline (featuring a long range order confined within the single grains), or an amorphous material (featuring a short range order).

The term "dielectric", as used herein, relates to an insulating material. For purposes which will be explained hereinbelow, in the following examples dielectric substrates have been selected which are also transparent to the electromagnetic radiation in the range of frequencies of the visible spectrum. Particularly, a (soda-lime) glass with lateral dimensions of about 1.5×1.5 cm$^2$ and of a thickness of about 100 μm, and a polymer (Arylite™) with the same dimensions have been selected. The specific dimensions of the substrate do not turn out to be critical to the purposes of the described process. More generally, the type of dielectric substrate is not crucial to the purposes of the process according to the invention.

In this context, the interface "smoothness" or "planarity" is defined in terms of the average quadratic roughness (RMS), determined by atomic force microscopy (AFM), on sampling windows of a lateral size of 6 μm. A planar substrate has a RMS roughness of the order of magnitude of a few nm, that is, significantly smaller (at least one order of magnitude) of the height of the nanowires produced via the proposed method (typically, approximately some tens nm).

In a second step 120, the method according to the invention provides for the deposition of a metal film M on the planar substrate D.

The term "film deposition", as used herein, relates to the growth process on a substrate of a compact layer of material having a different chemical composition relative to the substrate. According to the present invention, it is a metallic material. According to the substrate-film combination and the growth conditions, the film can be crystalline, polycrystalline or amorphous. In any case, the method according to the invention is not limited to a specific process (chemical, electrochemical, physical) to achieve the film growth on the substrate.

To implement the array of nanowires, the method therefore provides for (step 130) irradiating the metal film M with a defocused beam IB of noble gas ions under high vacuum. By defocused beam is meant a beam of ions with a central region having a homogeneous flow. In this useful area, it shall be appreciated that the arrival of new ions occurs in a temporarily and spatially stochastic manner. In the examples indicated below, such area has a diameter (width) of few cms (there are commercial ion sources which can arrive also up to 200 mm diameter, according to the source). The higher the beam dimensions are, the higher is the processed area to obtain the required nanostructures. The angular divergence of the defocused beam has to be minimized: the typical divergences of less than 10 degrees obtained from ion sources with multiple-opening extracting grids are sufficient to the efficient operation of the method. However, the method according to the invention is not limited to a specific type of ion source, provided that the angular divergence is limited below said value.

Advantageously, the ion beam irradiation occurs in the same vacuum chamber in which the metal film deposition is performed.

During ion irradiation, the emission of electrons from a filament arranged proximate the ion gun outlet is controlled so as to compensate the build-up of charges on the dielectric substrate due to the implantation of positive ions.

During the ion irradiation, the film and substrate temperature has to be controlled so as to prevent overheating. Overheating is caused by the ion beam irradiation or the thermal radiation of the neutralizing filament. In the context of the method, the temperature has to be reduced (i) in the case of a polymeric substrate, below the glass transition temperature $T_g$ for the material, that is, the temperature above which the polymer softens, or (ii) below the temperature to which the metal nanostructures decay by diffusive relaxation.

The incidence angle θ of the ion beam IB relative to the perpendicular n to the metal film surface m1 has to be above 0 degrees. Under grazing incidence conditions as illustrated in FIG. 2, that is, with θ above about 70 degrees, the required nanostructures arrange, according to a plane view, parallel to the ion beam direction.

As explained above, the ion irradiation induces the morphologic self-organization of the metal film surface M.

According to step 140 of the method according to the invention, the beam IB generates a corrugation on the metal film surface m1, formed by a plurality of mutually parallel self-organized nanoscale corrugations r, as illustrated in FIG. 3(*a*). In order to activate, on the film surface, the instability required for the self-organization, ion doses are required, which depend on the initial roughness and the dimensions of the possible grains of the metal film. Lower values of initial roughness and grain dimension of a polycrystalline film involve a displacement of the activation threshold for the self-organization at lower ion doses. Films with higher grain sizes and higher planarity result in a reduction of the film resistivity due to the reduction of the density of the grain edges and the nanowires interconnection and length.

By increasing the ion dose (step 150), an increase of the peak height of the self-organized corrugations r relative to the valleys t sandwiched therebetween, as illustrated in FIG. 3(*b*) is induced. The increase of the corrugations r width is due to the instability induced by the ion beam, while the valleys t are eroded under the action of the erosion actuated by said beam. In this regard, the film M initial thickness is selected according to the initial grain size and roughness, so that, after the self-organization has started, a sufficient film thickness is available for the amplification of the corrugations of the surface corrugation.

By further increasing the ion dose (step 160), the ion beam IB begins to erode the entire metal film, until when the bottom of the valleys t reaches the substrate D surface, causing the exposure thereof, as illustrated in FIG. 3(*c*). In this way, the film M is made discontinuous at the valleys t, thereby generating an array of metal nanowires w.

By further increasing the ion dose (step 170) the nanowires w transversal cross-section is reduced in a controlled manner, so as to adjust the plasmon resonances, wavelength which can be associated thereto. As the nanowires cross-section decreases, therefore the gap between each nanowire and those immediately adjacent increases, the position of the localized plasmon resonance peak moves to lower wavelengths. It has been noticed that, following the formation of the nanowire array, the metal film M electric resistivity becomes highly anisotropic, being the charge transfer highly promoted in the nanowires extension direction compared to the transversal direction.

EXAMPLES

As stated before, arrays of metal nanowires on substrates of soda-lime glass (Example 1) and Arylite™ (Example 2) have been produced.

In both examples, Au was deposited on the substrate by thermal evaporation, thus obtaining a polycrystalline film. Deposition and ion irradiation occurred in the same vacuum chamber, at a base vacuum level of the order of $10^{-7}$ mbar, obtained by a turbomolecular pump.

The ion beam was composed of ionized Ar accelerated to energies of approximately 800 eVs. The typical flow of the beam was $5.5 \cdot 10^{14}$ ions/cm$^2$ sec. The ion source generated a uniform beam with a diameter of about 2 cm. Said a beam was under grazing incidence conditions, and particularly with θ of approximately 80 degrees.

In both examples, the temperature during the irradiation was preferably controlled at about 230 K, to control atomic diffusion in the Au films. In fact, atomic diffusion of the Au films is highly efficient also at room temperature, that is, at a temperature well below the Arylite™ softening temperature ($T_g$=325° C.).

The obtained Au film thickness was 150 nm, with a corresponding RMS roughness of 5 nm and an average diameter of the grains of about 100 nm.

Under these conditions, in order to activate the self-organization instability on the polycrystalline film surface, an ion dose Θ of $1 \times 10^{18}$ cm$^{-2}$ is typically required.

Example 1

Example 1 shows the method for the synthesis of an array of Au nanowires supported on a soda-lime glass dielectric substrate. The initial thickness of the Au film is 150 nm, and the film is grown by thermal evaporation.

Figure 4:
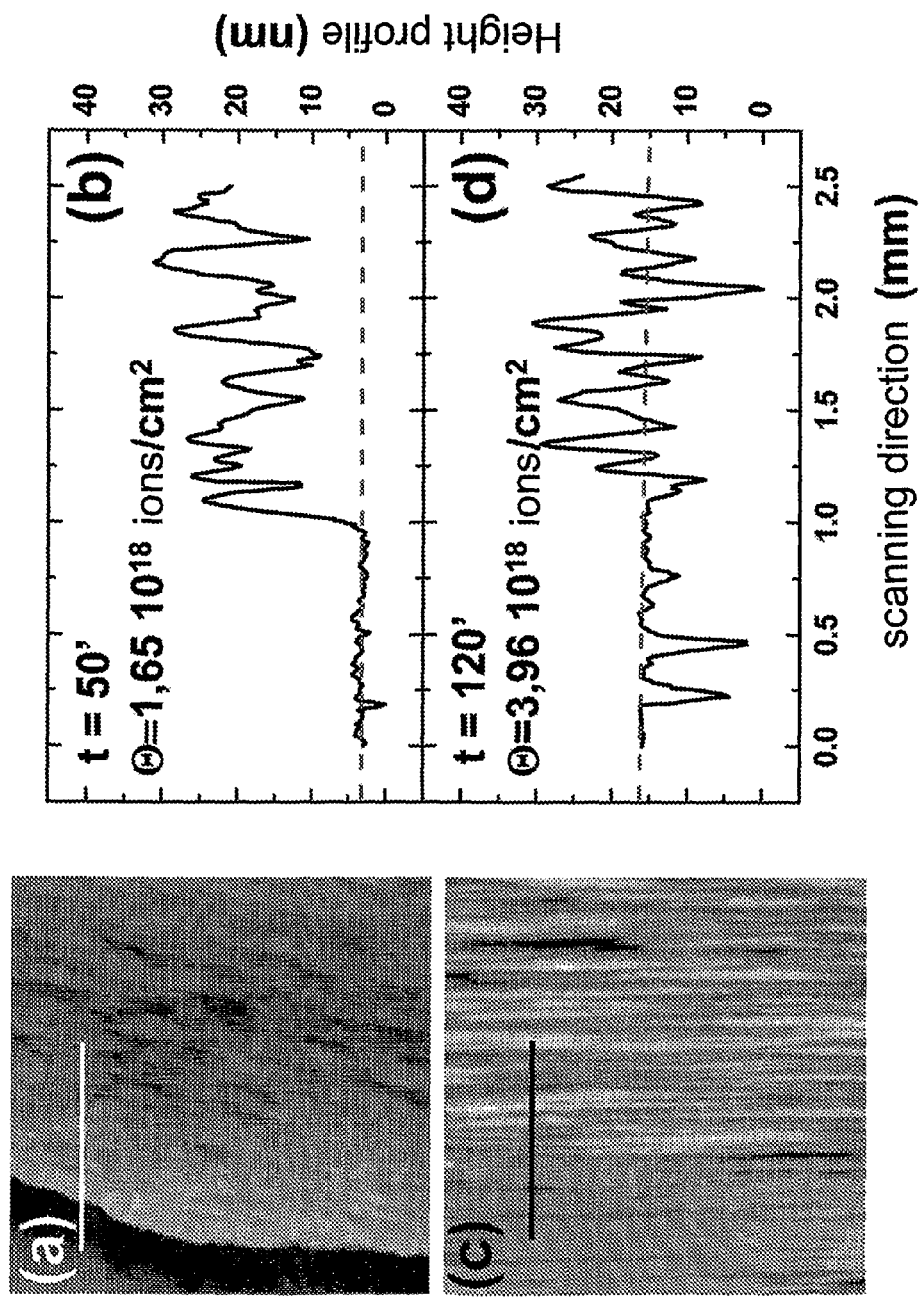
FIG. 4 illustrate: (a) the morphological evolution of a 150 nm Au film supported on a (soda-lime) glass substrate after an ion irradiation time of 50 minutes (corresponding to a dose $\Theta=1.65 \cdot 10^{18}$ ions/cm$^2$). The topography obtained by atomic force microscopy (image size, 3×3 μm$^2$) shows a connected film. A scratch on the metal film exposes the buried glass substrate. (b) Monodimensional linear profile along the direction indicated in FIG. 4(a). (c) Morphological evolution of a 150 nm Au film supported on a (soda-lime) glass substrate after an ion irradiation time of 120 minutes (corresponding to a dose $\Theta=3.96 \cdot 10^{18}$ ions/cm$^2$). The atomic force topography (image size, 3×3 μm$^2$) shows an array of unconnected Au nanowires. A scratch on the metal film exposes the glass substrate which exhibits scratched grooves. (d) Monodimensional linear profile along the direction indicated in FIG. 4(c)

FIG. 4(*a*) shows the morphology of the Au film after a 50 min ion irradiation, corresponding to a dose Θ=1.65 $10^{18}$ ions/cm$^2$. The Au film is still connected, exhibits well-developed corrugations, with an average periodicity of about 110 nm, and there are no exposed areas of the glass substrate. In FIG. 4(*b*), an AFM monodimensional vertical profile along a scratch on the metal film shows the planar glass substrate and the corrugated Au film thickness. The typical width of the corrugations is about 20 nm. By increasing the sputtering time beyond 65 minutes, the bottom of the valleys of the Au corrugations reaches the glass substrate.

By further continuing irradiation up to 120 minutes, corresponding to a dose Θ=3.96 $10^{18}$ ions/cm$^2$ (FIG. 4(*c*)), the Au corrugations are disconnected, thus exposing the glass substrate. Thereby, Au nanowires are generated, which are mutually spaced by gaps which increase as the ion dose increases.

In FIG. 4(*d*), an AFM monodimensional vertical profile along a scratch on the metallic surface shows the glass substrate having deeply scratched grooves at the bottom of the Au film valleys. The typical width of the Au nanowires is about 15 nm. The typical lateral periodicity of the nanowires is about 110 nm, while their length reaches values of a few micrometers. The aspect ratio of the nanowires is about 10.

Figure 5:
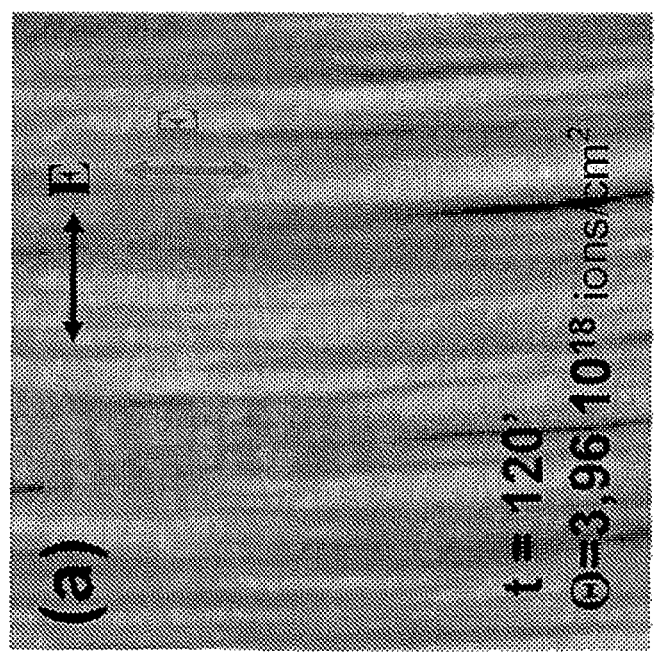
FIG. 5 illustrate: (a) Image by atomic force microscopy of the array of unconnected Au nanowires after irradiating for 120 minutes, corresponding to a dose $\Theta=3.96 \; 10^{18} \cdot$ions/cm$^2$ (image size, 3×3 μm$^2$). The arrows define the TM and TE polarizations respectively corresponding to the perpendicular or parallel electric field with respect to the axis of the nanowires. (b) Spectrally-resolved transmittance of the polarized light showing the presence of a large absorption peak due to the excitation of localized plasmon resonances by the TM-polarized radiation.
Figure 5:
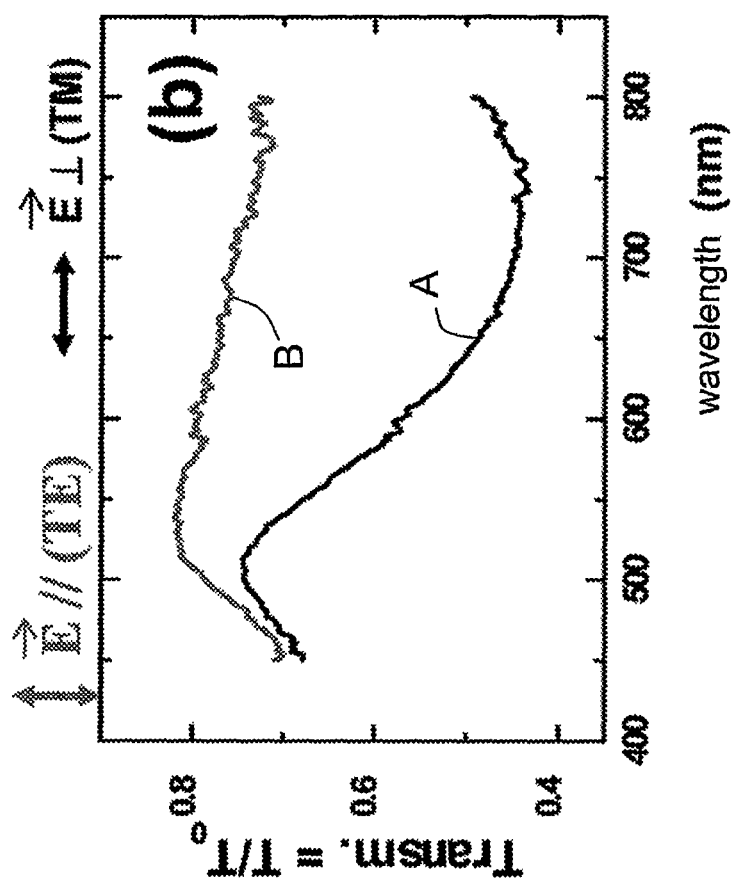

In FIG. 5, the transmittance of polarized light is determined, through the array of disconnected nanowires supported on the glass substrate, corresponding to a dose Θ=1.65 $10^{18}$ ions/cm$^2$, the morphology of which is represented in FIG. 5(*a*). The transmittance reveals that the transmitted light color changes by rotating the light polarization, form parallel to perpendicular to the array of nanowires. The cause for the color shift is highlighted by a spectrally-resolved measurement of the transmitted intensity (FIG. 5(*b*)). The measurement shows that, after the nanowires disconnection, the transmittance spectrum for the polarized light with the electric field oriented transversally to the nanowires axis (TM mode—curve A) has a marked minimum, due to the excitation of localized surface plasmon resonances (LSPRs). With a parallel polarization (TE mode—curve B), the transmittance spectrum is similar to that of a continuous Au film. The dichroic ratio at the transmittance minimum at 730 nm is 30%. By altering the nanowire section, thus increasing the ion dose, it is possible to adjust the spectral position of the localized plasmon resonance. By decreasing the Au nanowire section, the resonance wavelength shifts towards the blue.

Example 2

Example 2 shows the method for the synthesis of an array of Au nanowires supported on a flexible polymeric substrate, particularly Arylite™. The initial thickness of the polycrystalline Au film is 150 nm, and the film is grown by thermal evaporation.

Figure 6:
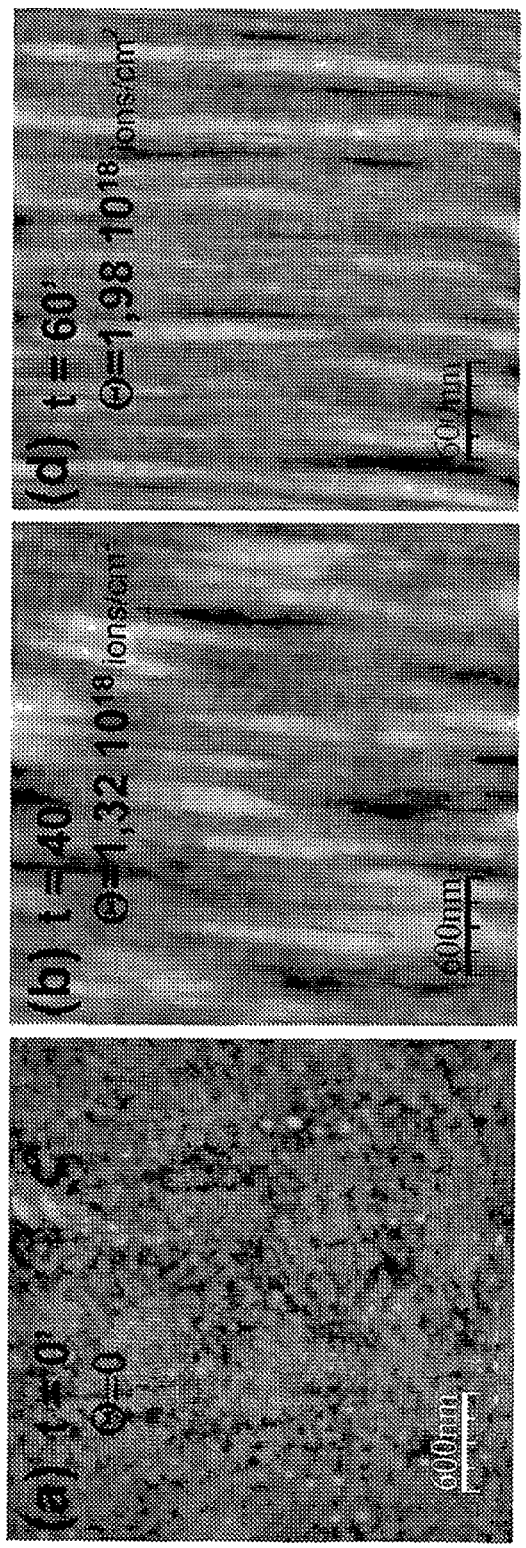
FIG. 6 illustrate: (a) Image by atomic force microscopy of a polycrystalline Au film supported on a polymeric substrate (Arylite™) (image size, 3×3 μm$^2$). (b) Morphology of the Au film after ion irradiation for 40 minutes, corresponding to a dose Θ=1.32·10$^{18}$ ions/cm$^2$. (c) Spectral transmittance of the connected film of FIG. 6(b) showing absence of dichroic behaviour. (d) Morphology of the Au film after ion irradiation for 60 minutes, corresponding to a dose Θ=1.98·10$^{18}$ ions/cm$^2$. (e) Spectral transmittance of the film of FIG. 6(d) showing absence of dichroic behaviour and increase of the transmitted signal after film erosion. (f) Morphology of the Au film after ion irradiation for 75 minutes, corresponding to a dose Θ=2.48·10$^{18}$ ions/cm$^2$. (g) Spectral transmittance of the film of FIG. 6(f) showing appearance of dichroic absorption at the disconnection of the nanowires. Furthermore, it is noticed an increase of the transmittance due to the film thickness reduction by ion erosion. (h) Morphology of the Au film after ion irradiation for 80 minutes, corresponding to a dose Θ=2.64·10$^{18}$ ions/cm$^2$, increasing the disconnection of the nanowires and decreasing the cross-section thereof. (i) Spectral transmittance of the film of FIG. 6(h), showing a displacement of the plasmon absorption peak to shorter wavelengths.
Figure 6:
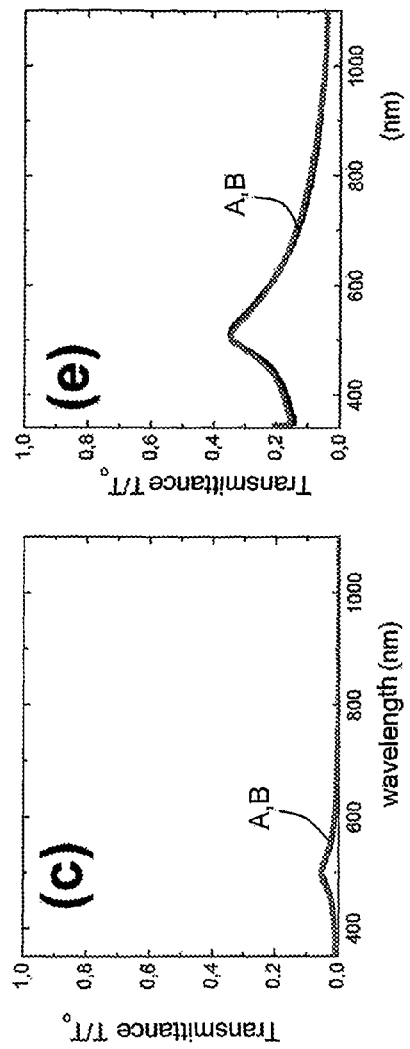
Figure 6:
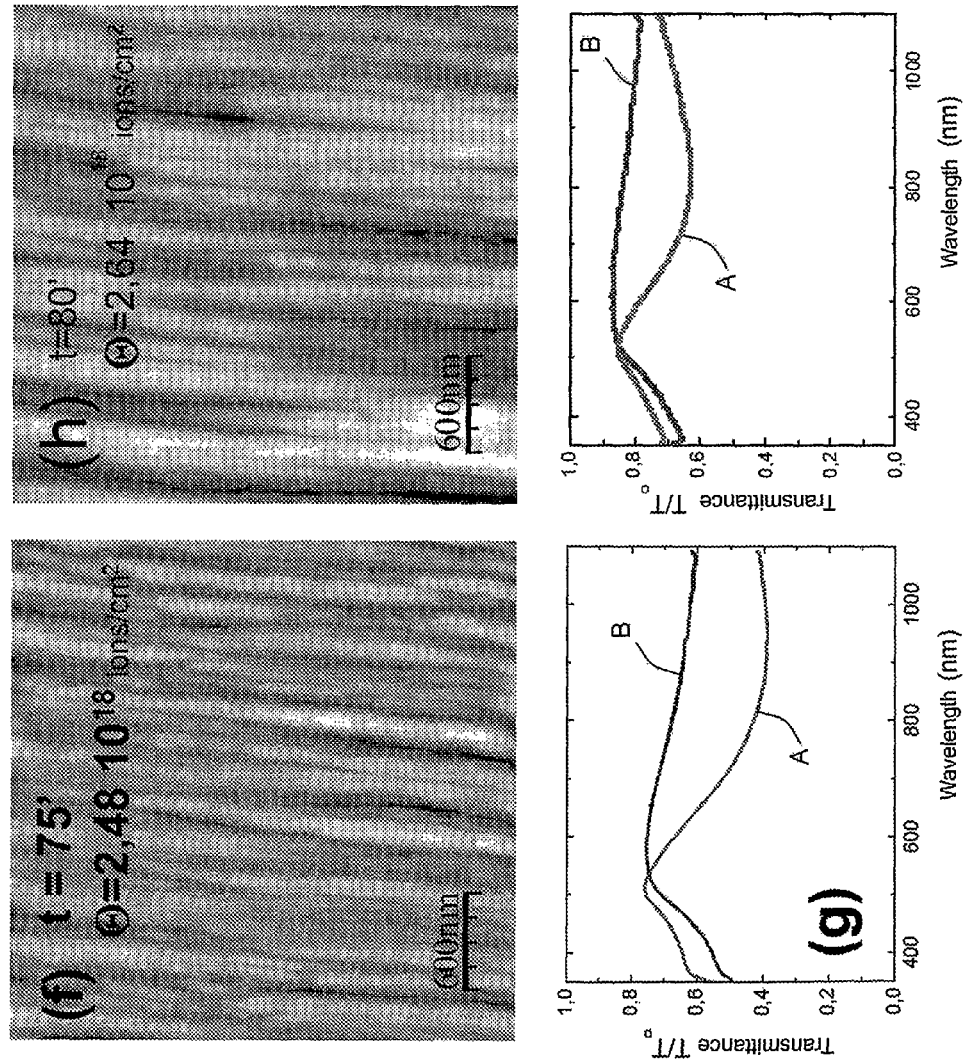

FIG. 6(a) shows the compact isotropic morphology of the Au film before ion irradiation. After 40 minutes irradiation, corresponding to a dose Θ=1.32 10$^{18}$ ions/cm$^2$, a well-developed corrugated pattern is formed on the metal film surface (FIG. 6(b)). The modulation period of the corrugations is about 120 nm. The transmittance spectrum of the polarized light corresponding to the morphologic conditions of FIG. 6(b) is plotted in FIG. 6(c). The curves for the TE and TM modes are overlapping: the metal film is connected, and no excitation of localized plasmon resonances is possible. Due to the metal film thickness, the overall transmittance is low.

By further increasing the irradiation time up to 60 minutes (after a dose Θ=1.98 10$^{18}$ ions/cm$^2$) (FIG. 6(d) and FIG. 6(e)) the transmittance further increases, due to the metal film erosion. The transmittance of the TE and TM modes is still comparable, since the metal film is connected.

After 75 minutes irradiation, corresponding to a dose Θ=2.48 10$^{18}$ ions/cm$^2$ (FIG. 6(f)), the valleys of the Au corrugations reach the polymeric substrate, and the nanowires begin to disconnect. The optical transmittance spectra (FIG. 6(g)) manifestly show a dichroic behaviour. The curve A relative to the TM mode has a wide absorbance minimum at about 950 nm, due to the excitation of the transverse localized plasmon of the nanowires. The absorption spectrum for the polarized light in the TE mode (curve B) is comparable to that in the case of a connected film. The overall transmittance further increases, since the Au thickness is reduced by ion erosion.

By further increasing the sputtering time up to 80 minutes (after a dose Θ=2.64 10$^{18}$ ions/cm$^2$) (FIG. 6(h)), the overall thickness (width) of the nanowires, and the transversal cross-section thereof are reduced by ion erosion. The transmittance spectrum (FIG. 6(i)) shows a shift of about 150 nm of the localized plasmon resonance position towards the blue.

As it can be noticed in both examples, the method according to the invention allows adjusting the localized plasmon resonance spectral position by simply altering the ion dose and, consequently, the transversal cross-section of the metal nanowires.

Therefore, the method according to the invention provides a low cost and high throughput approach for the synthesis of metal nanowires supported on a dielectric substrate, and particularly, as indicated in the Example 2, on a flexible polymeric substrate. The broad band plasmon absorption spectrum of the plasmon resonances (FIG. 5(b)) can be adapted to the solar spectrum distribution in the visible range [J. Cole, N. J. Halas, Applied Physics Letters 89, 153120 (2006)]. Therefore, an application of such substrates is foreseen as low cost supports for flexible and transparent thin-film photovoltaic junctions, characterized by a higher efficiency due to the plasmonically-enhanced photovoltaic conversion.

As it is known, in the construction of some types of photonic devices, and particularly thin-film photovoltaic devices, it is generally necessary to manufacture electrodes which are transparent to light radiation, while allowing the light to reach the photoactive region where the charge carriers are generated, and to convey such carriers to the load. Such electrodes are generally manufactured by depositing transparent conductive oxide layers (ad es., indium-tin oxide—ITO). The growth of such conductive oxide layers, and the thermal treatments required in said growth, represent an additional complexity level in the fabrication of a photovoltaic device, and significantly concur to overall efficiency losses (losses by optical absorbance, ohmic losses) [Transparent Conducting Oxides for Photovoltaics, E. Fortunato, D. Ginley, H. Hosono and C. Paine, MRS Bulletin 32 (3) 242 (2007)].

The present invention provides a method for the production of a photonic device overcoming the above-mentioned problems.

Briefly, a method for the production of a photonic device according to the invention comprises the steps of:
arranging a dielectric material substrate which is transparent to visible light, and
manufacturing, on said substrate, a plurality of electrodes and at least one active material layer capable of converting light energy into electric energy, or vice versa, which is at least partially interposed between said electrodes, in which the manufacturing of the electrodes comprises the following sub-steps:
depositing a metal film on the substrate, the deposited metal film having a thickness $d_0 \leq d_0^{Au} \cdot (\rho/\rho^{Au})$, where $d_0^{Au} = 110$ nm, $\rho$ is the resistivity of the metallic material of the film, and $\rho^{Au}$ is the Au resistivity; and
irradiating the metal film with a defocused beam of noble gas ions (IB) under high vacuum, so that, with increasing ion doses:
c1) a corrugation is produced on the metal film surface (m1), formed by a plurality of mutually parallel nanoscale self-organized corrugations (r);
c2) subsequently, the height of the peaks of the self-organized corrugations is increased relative to the valleys (t) interposed therebetween; and
c3) finally, the whole of the metal film is eroded so as to expose the substrate at the valleys, and to mutually disconnect the self-organized corrugations, thereby generating an array of metal nanowires.

The method proposed according to the invention provides a low cost and high throughput technique for the production of conductors supported on transparent dielectric substrates, also on relatively large areas, in which the nanowires arrays are aligned and have a lateral periodicity of the order of 100 nm.

Compared to the use of conductive oxides, it is possible to achieve significantly lower resistivity values; furthermore, thanks to the nanowires disconnection, it is possible to achieve a high optical transmittance, therefore an efficient light trasmittance to the active layers of the device. Alternative approaches for the replacement of the conducting oxides with thin metal films are under investigation. In some cases, an attempt was made to replace the ITO electrodes with a non-structured planar metal film [Transparent and conductive electrodes based on unpatterned, thin metal films, Brendan O'Connor, Chelsea Haughn, Kwang-Hyup An, Kevin P. Pipe, and Max Shtein, Appl. Phys. Lett. 93, 223304 (2008)]. In other cases, the planar film has nanometric openings obtained by colloidal lithography so as to increase the film optical transparency, by exploiting the plasmon resonances localized in the nanoslits of the film [Surface-plasmon enhanced transparent electrodes in organic photovoltaics, Thomas H. Reilly, III, Jao van de Lagemaat, Robert C. Tenent, Anthony J. Morfa, and Kathy L. Rowlen, Appl. Phys. Lett. 92, 243304 (2008)].

The method according to the invention is self-organized, therefore it does not require the use of lithographic masks or chemical processing operations.

Figure 7:
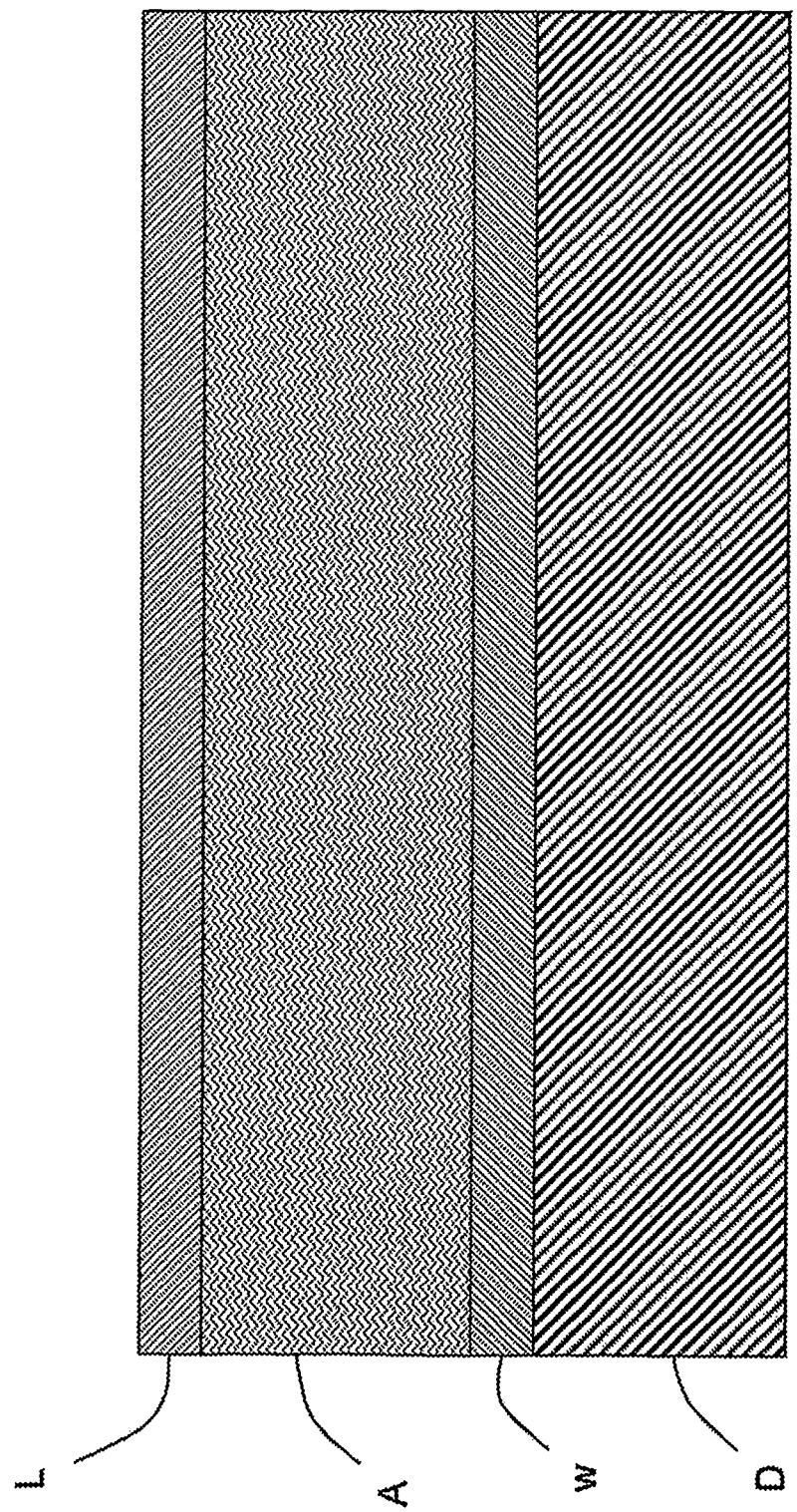
FIG. 7 is a reference scheme illustrating a possible configuration of the layers in a photonic device.

FIG. 7 illustrates an example of a configuration of layers in a thin-film photonic device. Said device comprises a dielectric material substrate D which is transparent to visible light, on which a plurality of electrodes w, L, and at least one active material layer A capable of converting light energy into electric energy, or vice versa, which is at least partially interposed between the electrodes w, L are obtained according to a predetermined pattern. At least one electrode (w) is composed of an array of metal nanowires obtained from a metallization layer M according to the technique which is the subject of the invention. The implementation modes for the active material layer A, and optionally the electrode L far from the transparent substrate D, can be per se conventional.

In order to obtain at the same time optimal optical properties (high transparency) and optimal electrical properties (low longitudinal layer resistance), the film planarity results to be an important parameter. By way of example, it is reported that arrays of nanowires obtained starting from corrugated substrates (rms roughness of about 6 nm) result to have an average elongation of the nanowires of about three times less than that obtained on substrates with rms roughness of about 1 nm. The overall longitudinal resistivity of the array of nanowires results to be directly depending on the nanowires length and the number of interconnections between nanowires. The described method identifies the optimal thickness do of the initial metal film, allowing, with a minimum consumption of sacrificial metal material, obtaining the highest optical transparency, compatibly with the smallest longitudinal layer resistance and the establishing of the lateral disconnection of the nanowires, so as to activate plasmon effects.

Advantageously, the metal film M is in noble metal, particularly Au or Ag. In fact, it is known that noble metal particles reduced to nanometric dimensions have unique optical properties in the visible spectrum range, due to the excitation of collective oscillations of conduction electrons known as localized surface plasmon resonances. The resonance frequency of surface plasmons strongly depends on the dimensions, shape, and dielectric environment of the nanoparticles, thus providing an efficient way to adjust the optical properties thereof [S. Malynych et al., JACS 125, 2869 (2003)]. Particularly, it has been suggested that the electromagnetic energy can be guided and confined below the diffraction limit along chains of closely spaced metal nanoparticles that convert the optical modes into non-radiating surface plasmons (plasmon waveguides) [S. A. Maier et al., Nature Materials, 2, 229 (2003)]. According to a promising aspect in view of the third-generation photovoltaic applications, the array of nanowires can have a broad absorption peak due to the excitation of the localized plasmon resonances, which is optimally adapted to the solar spectrum.

To an increase of the metal film initial thickness, there is a corresponding formation of nanowires having a higher cross-section, and consequently characterized by a lower longitudinal layer resistance; on the contrary, the optical transparency is increased starting from films with reduced initial thickness. It is possible to obtain arrays of nanowires with high optical transparency and low layer resistance, by reducing the initial roughness of the metal film so as to promote the growth of nanowires with higher elongation and consequently a higher connection.

Figure 8A:
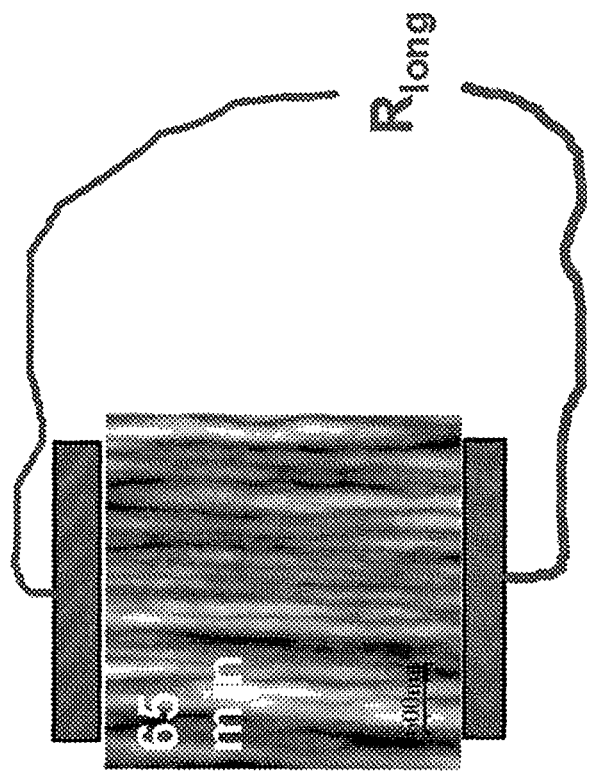
FIGS. 8a and 8b illustrate electric connection schemes of an array of metal nanowires, according to a configuration perpendicular to and according to a configuration parallel to the direction of the nanowires, respectively.
Figure 8B:
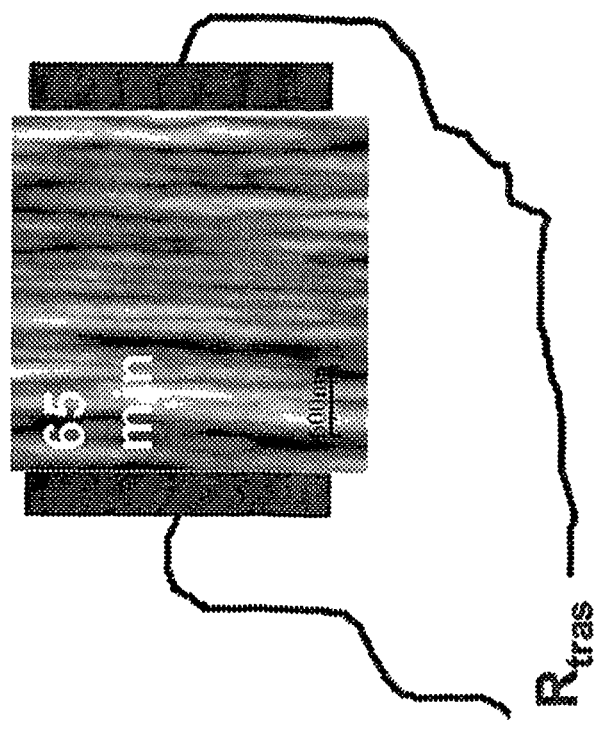
Figure 9:
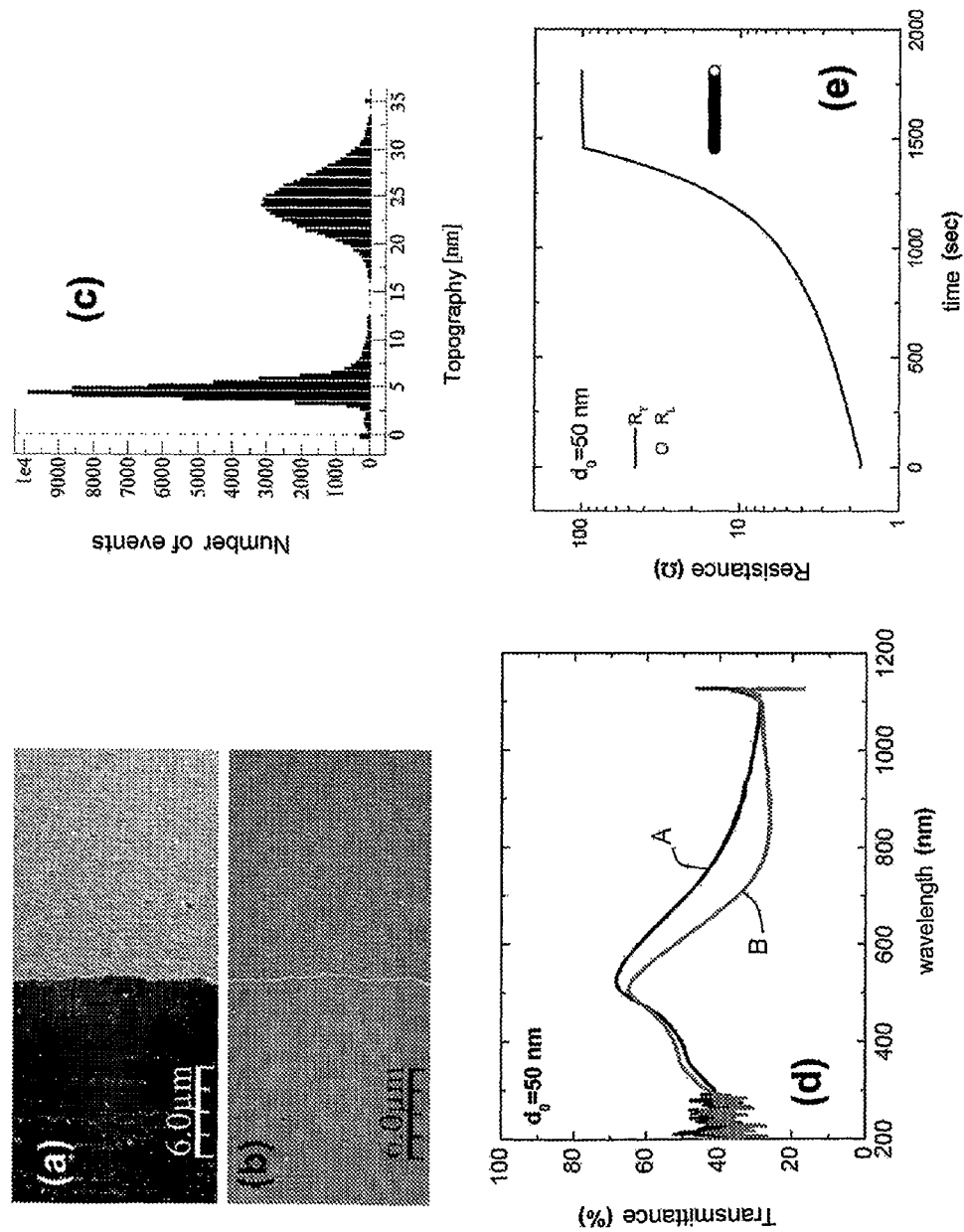
FIG. 9 illustrate: (a) topography of an Au film with 50 nm initial thickness supported on a (soda-lime) glass substrate nanostructured by IBS until when the transverse layer resistance reaches the value of 100 Ohm. The left portion of the AFM topography relates to a region of the film which has been mechanically removed by a sharp end, thus exposing the underlying glass substrate. The scratched grooves in the glass at the disconnection of the nanowires are visible as darker regions. (b) Numerically derived image to highlight topographic contrast. (c) Histogram describing the height distribution of the dots forming the images in FIG. 9a. (d) Transmission spectrum of polarized light through the array of nanowires with TE and TM polarization. (e) Graph of the trend of the transverse layer resistance as a function of the ion beam irradiation time. The longitudinal layer resistance has been measured at the end of the ion irradiation cycle.
Figure 10:
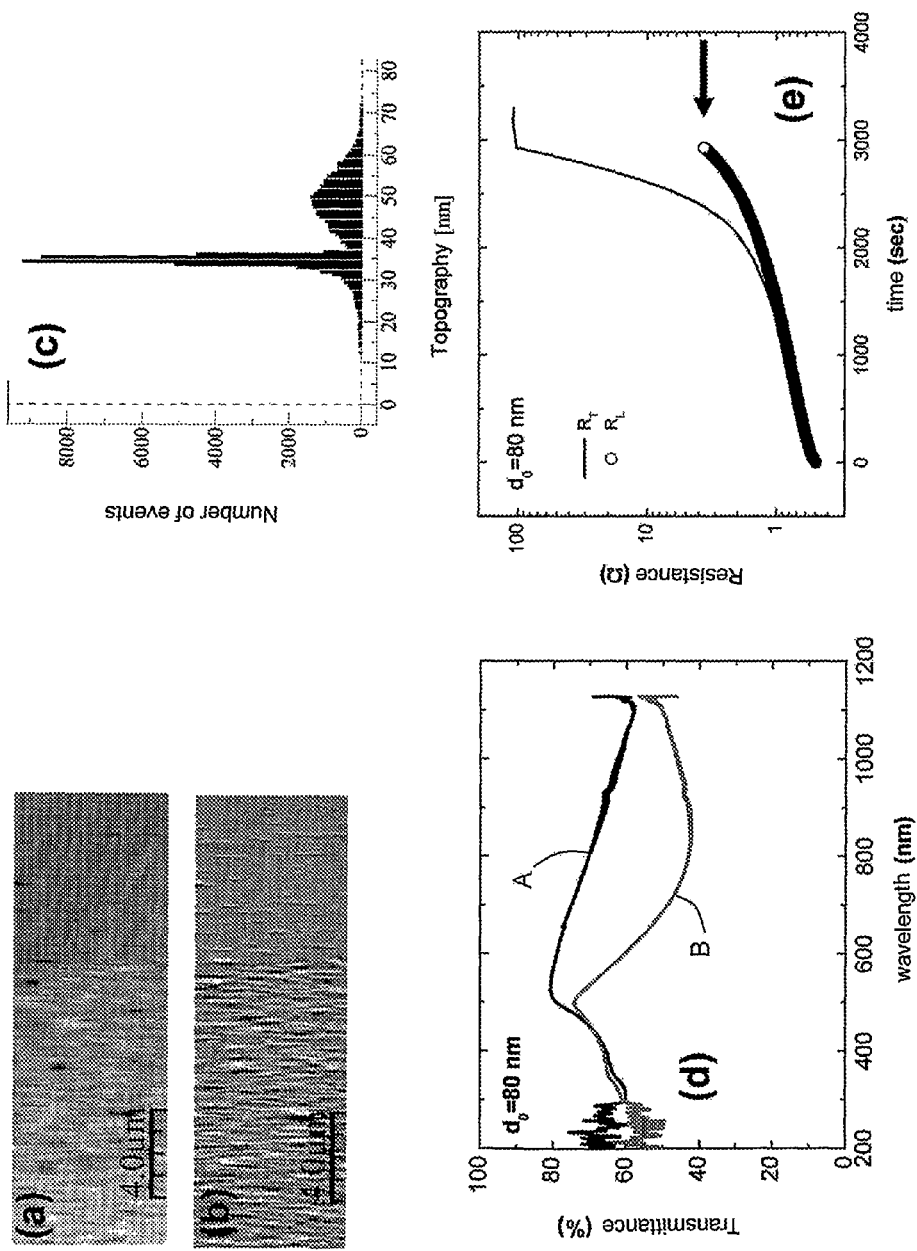
FIG. 10 illustrate: (a) topography of an Au film with 80 nm initial thickness supported on a (soda-lime) glass substrate nanostructured by IBS until when the transverse layer resistance reaches the value of 100 Ohm. The right portion of the AFM topography relates to a region of the film which has been mechanically removed by a sharp end, thus exposing the underlying glass substrate. The scratched grooves in the glass at the disconnection of the nanowires are visible as darker regions. (b) Numerically derived image to highlight topographic contrast. (c) Histogram describing height distribution of the dots forming the images in FIG. 10a. (d) Transmission spectrum of polarized light through the array of nanowires with TE and TM polarization. (e) Graph of the trend of the transverse layer resistance and longitudinal layer resistance as a function of the ion irradiation time.
Figure 11:
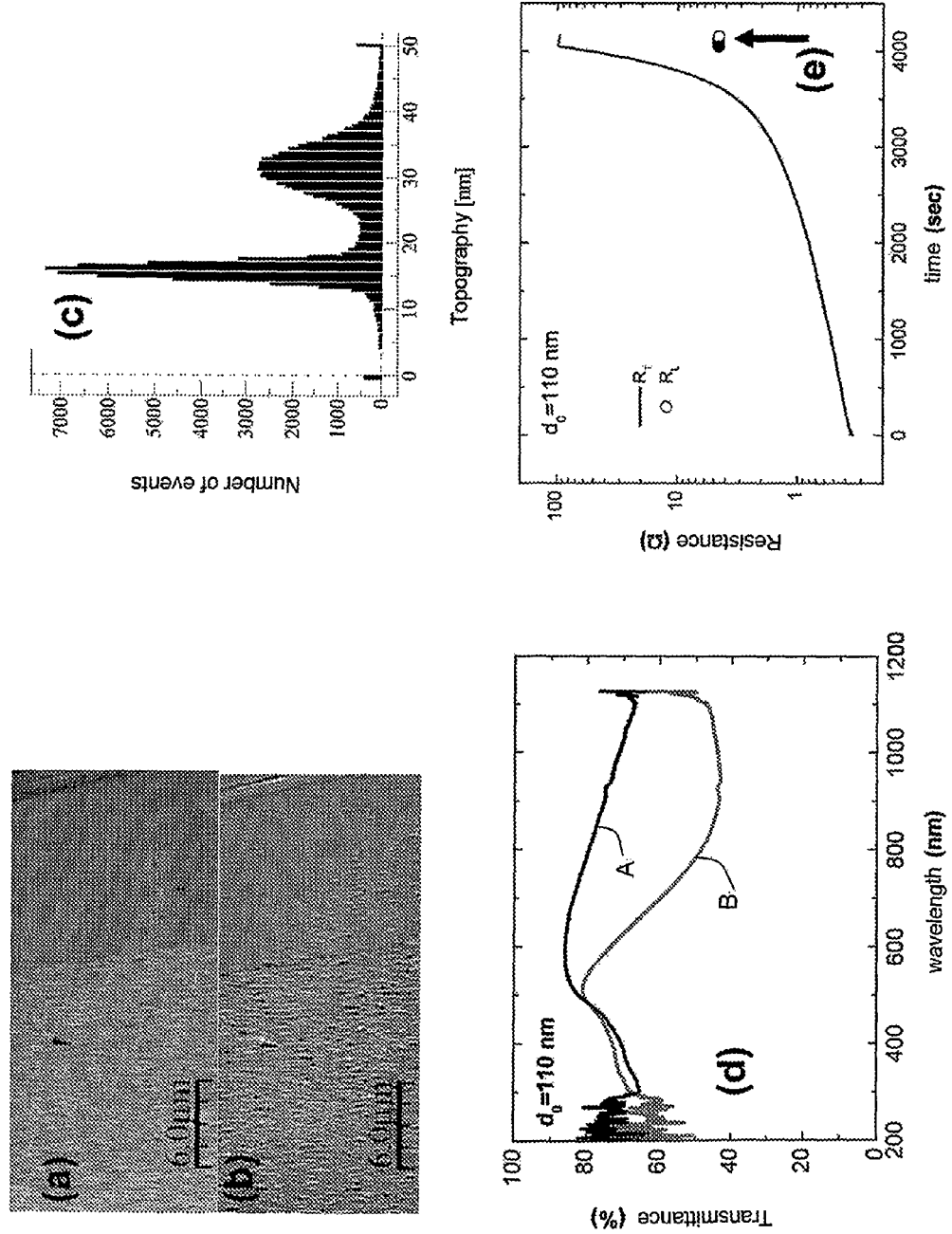
FIG. 11 illustrate: (a) topography of an Au film with 110 nm initial thickness supported on a (soda-lime) glass substrate nanostructured by IBS until when the transverse layer resistance reaches the value of 100 Ohm. The right portion of the AFM topography relates to a region of the film which has been mechanically removed by a sharp end, thus exposing the underlying glass substrate. The scratched grooves in the glass at the disconnection of the nanowires are visible as darker regions. (b) Numerically derived image to highlight topographic contrast. (c) Histogram describing height distribution of the dots forming the images in FIG. 11a. (d) Transmission spectrum of polarized light through the array of nanowires with TE and TM polarization. (e) Graph of the trend of the transverse layer resistance as a function of the ion beam irradiation time. The longitudinal layer resistance has been measured at the end of the ion irradiation cycle.
Figure 12:
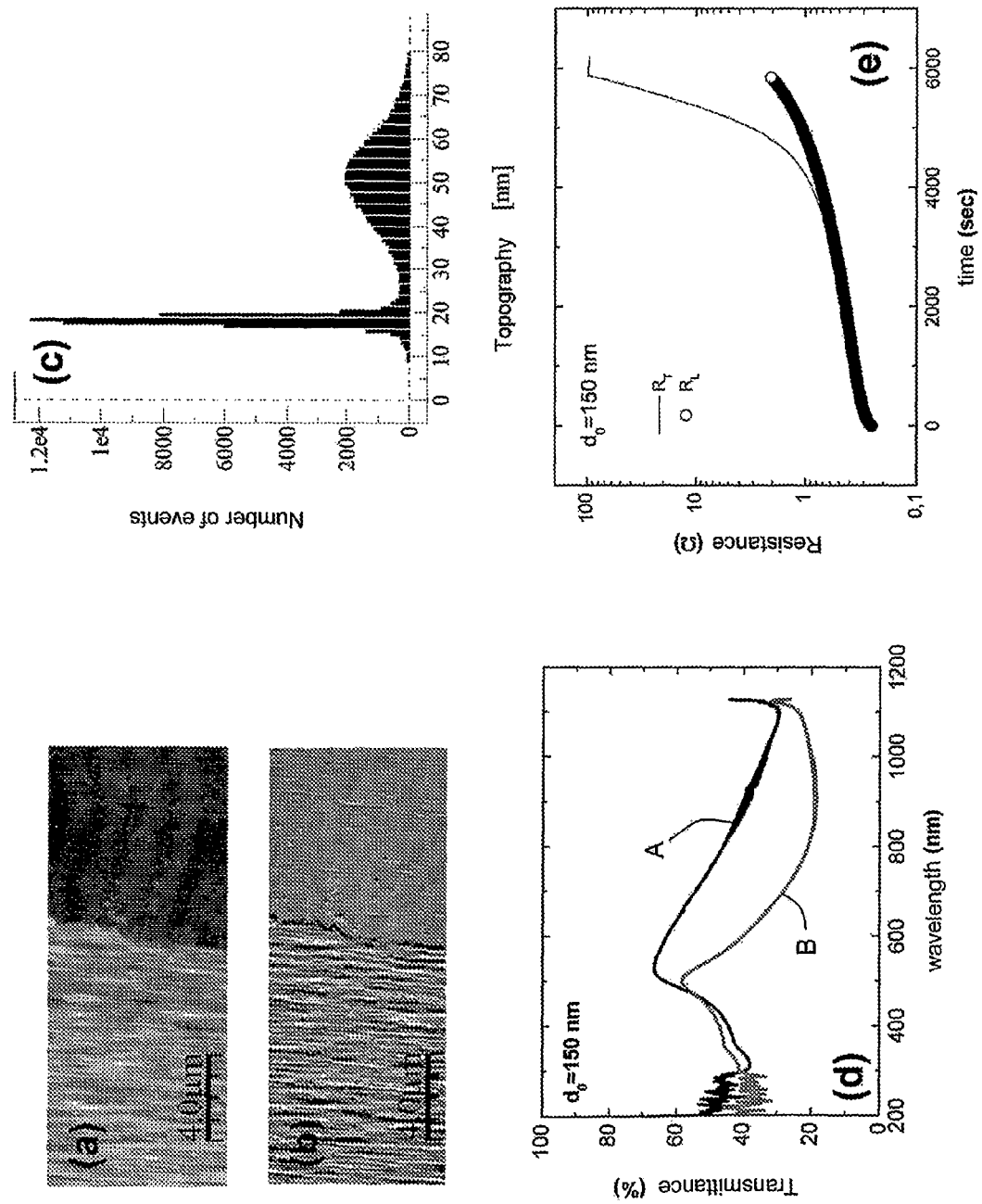
FIG. 12 illustrate: (a) topography of an Au film with 150 nm initial thickness supported on a (soda-lime) glass substrate nanostructured by IBS until when the transverse layer resistance reaches the value of 100 Ohm. The right portion of the AFM topography relates to a region of the film which has been mechanically removed by a sharp end, thus exposing the underlying glass substrate. The scratched grooves in the glass at the disconnection of the nanowires are visible as darker regions. (b) Numerically derived image to highlight topographic contrast. (c) Histogram describing height distribution of the dots forming the images in FIG. 12a. (d) Transmission spectrum of polarized light through the array of nanowires with TE and TM polarization. (e) Graph of the trend of the transverse layer resistance and longitudinal layer resistance as a function of the ion irradiation time.
Figure 13:
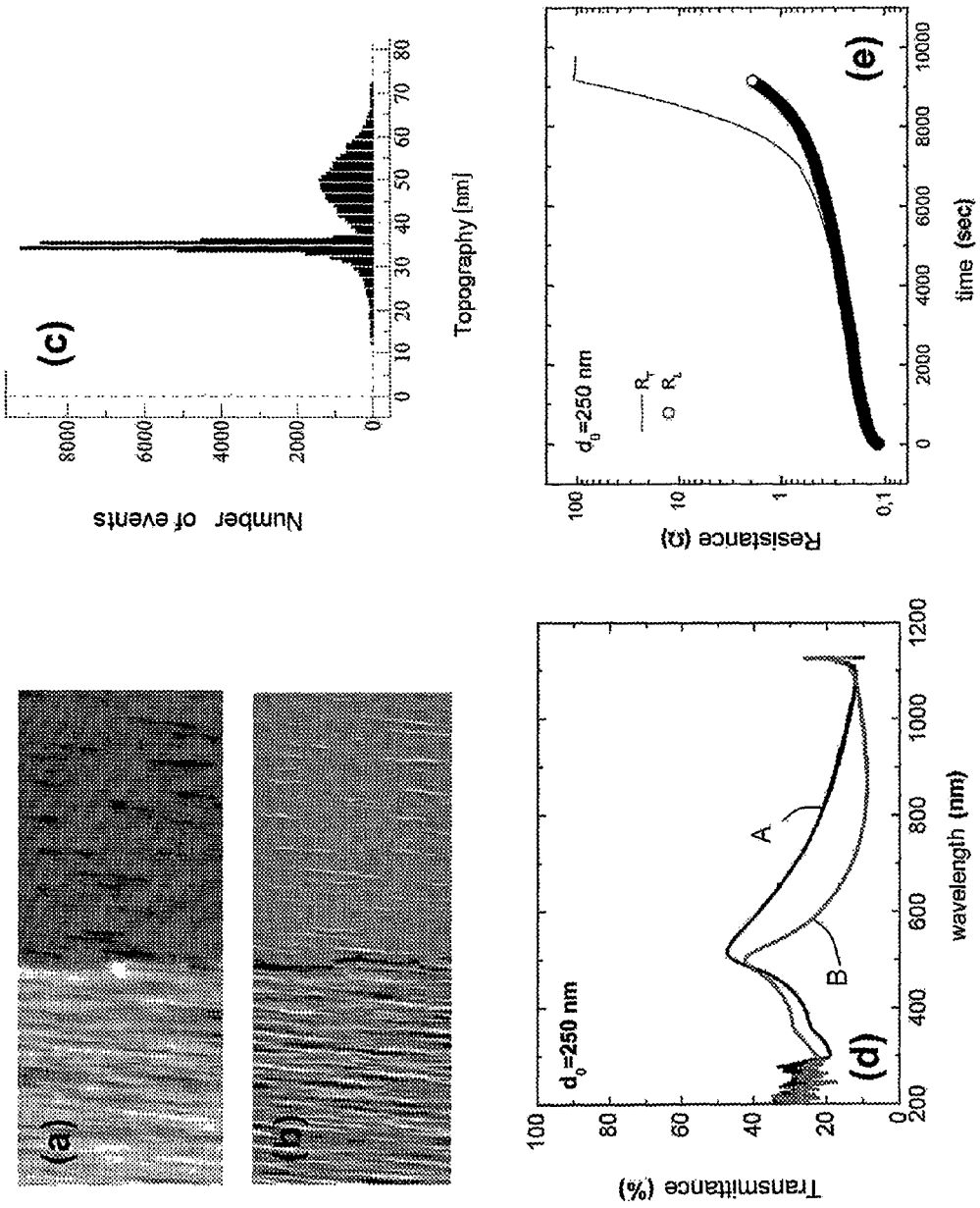
FIG. 13 illustrate: (a) topography of an Au film with 250 nm initial thickness supported on a (soda-lime) glass substrate nanostructured by IBS until when the transverse layer resistance reaches the value of 100 Ohm. The right portion of the AFM topography relates to a region of the film which has been mechanically removed by a sharp end, thus exposing the underlying glass substrate. The scratched grooves in the glass at the disconnection of the nanowires are visible as darker regions. (b) Numerically derived image to highlight topographic contrast. (c) Histogram describing height distribution of the dots forming the images in FIG. 13a. (d) Transmission spectrum of polarized light through the array of nanowires with TE and TM polarization. (e) Graph of the trend of the transverse layer resistance and longitudinal layer resistance as a function of the ion irradiation time.
Figure 14:
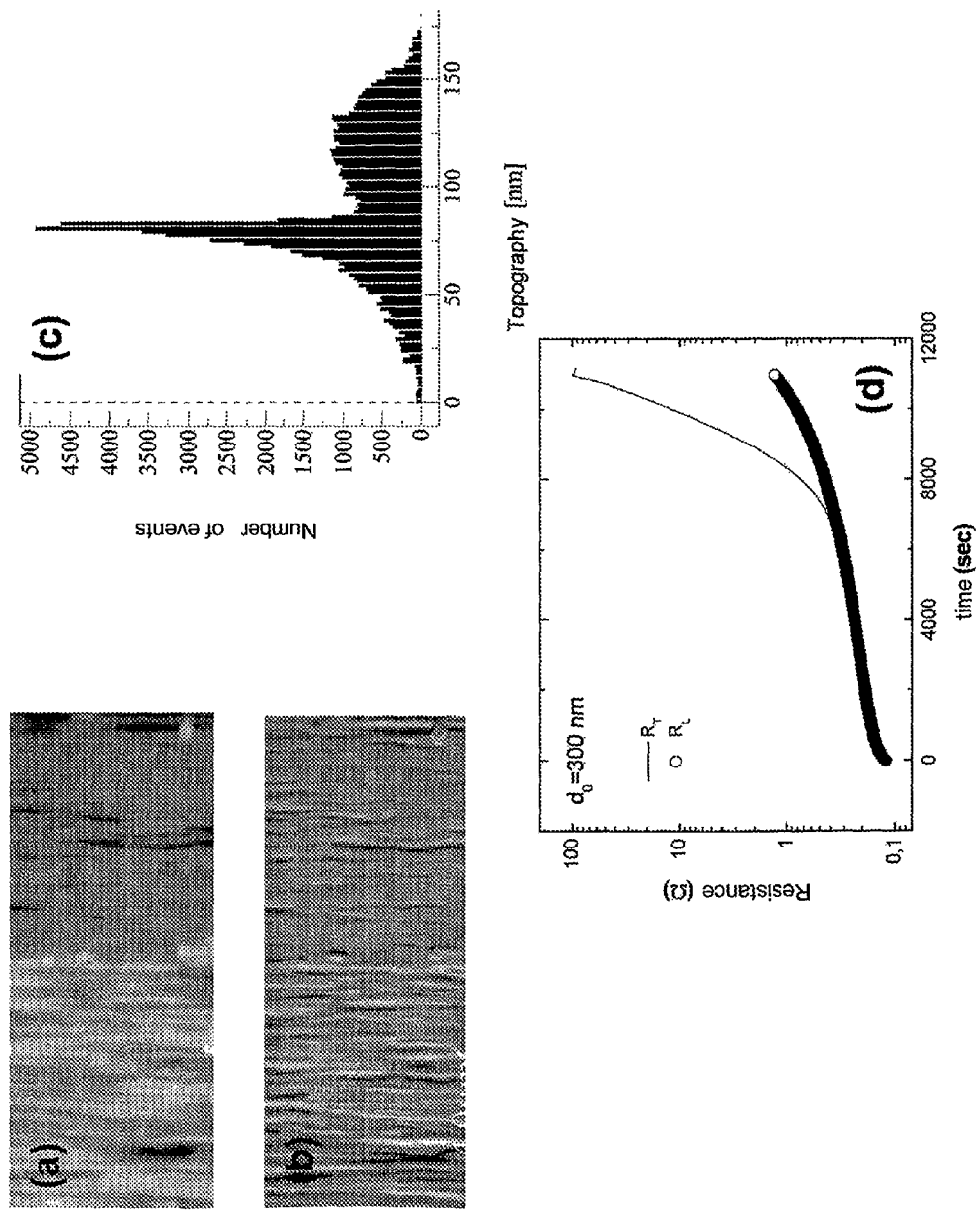
FIG. 14 illustrate: (a) topography of an Au film with 300 nm initial thickness supported on a (soda-lime) glass substrate nanostructured by IBS until when the transverse layer resistance reaches the value of 100 Ohm. The right portion of the AFM topography relates to a region of the film which has been mechanically removed by a sharp end, thus exposing the underlying glass substrate. The scratched grooves in the glass at the disconnection of the nanowires are visible as darker regions. (b) Numerically derived image to highlight topographic contrast. (c) Histogram describing height distribution of the dots forming the images in FIG. 14a. (d) Graph of the trend of the transverse layer resistance and longitudinal layer resistance as a function of the ion irradiation time.

Resistivity measurements were performed in situ during the IBS treatment of the polycrystalline metallic films described with reference to FIGS. 4a-4d, by adopting a 4 wires scheme. As illustrated in FIG. 8, two configurations of electrodes were used, corresponding to the measurement of the layer resistivity of the Au films in a perpendicular direction, $R_{tras}$ or $R_T$, (FIG. 8a) and in a parallel direction $R_{long}$ or $R_L$ (FIG. 8b), relative to the corrugations.

In FIGS. 7 to 12, measurements performed on metal films with increasing initial thickness from 50 nm, 80 nm, 110 nm, 150 nm, 250 nm, and 300 nm are reported. FIGS. 7(a), 8(a), 9(a), 10(a), 11(a), 12(a) illustrate the topography of the Au film supported on a (soda-lime) glass substrate after nanostructuration by IBS until when the transverse layer resistance reaches the value of 100 Ohm. The darker part of the AFM topography relates to a film region which has been mechanically removed by a sharp end, thus exposing the underlying glass substrate. The scratched grooves in the glass at the disconnection of the nanowires are visible as darker regions. FIGS. 7(b), 8(b), 9(b), 10(b), 11(b), 12(b) illustrate the numerically derived image to highlight topographic contrast. FIGS. 7(c), 8(c), 9(c), 10(c), 11(c), 12(c) illustrate a histogram describing height distribution of the dots forming the images in FIG. 7(a), 8(a), 9(a), 10(a), 11(a), 12(a). FIGS. 7(d), 8(d), 9(d), 10(d), 11(d) illustrate the transmission spectrum of polarized light through the array of nanowires with TE (longitudinal electric field—track A) and TM polarization (transversal electric field—track B).

In FIGS. 7(e), 8(e), 9(e), 10(e), 11(e), 12(e) the layer resistance of Au films having a different initial thickness $d_0$ is illustrated, measured parallel (circles) and transversally (thin lines) to the direction of the corrugations/nanowires according to the configurations illustrated in FIG. 8. The layer resistance increases as a function of the sputtering time (ion dose) due to the fact that the film thickness accordingly decreases. The thickness d decreases as a function of the sputtering time t according to the law $d=d_0(1-\alpha t)$, where $\alpha$ is the erosion rate of the Au film (in the examples shown, $\alpha \approx 0.022$ nm/sec). For the films having an initial thickness $d_0=50$ nm and $d_0=110$ nm, the longitudinal layer resistance was determined at the end of the irradiation period.

Figure 15:
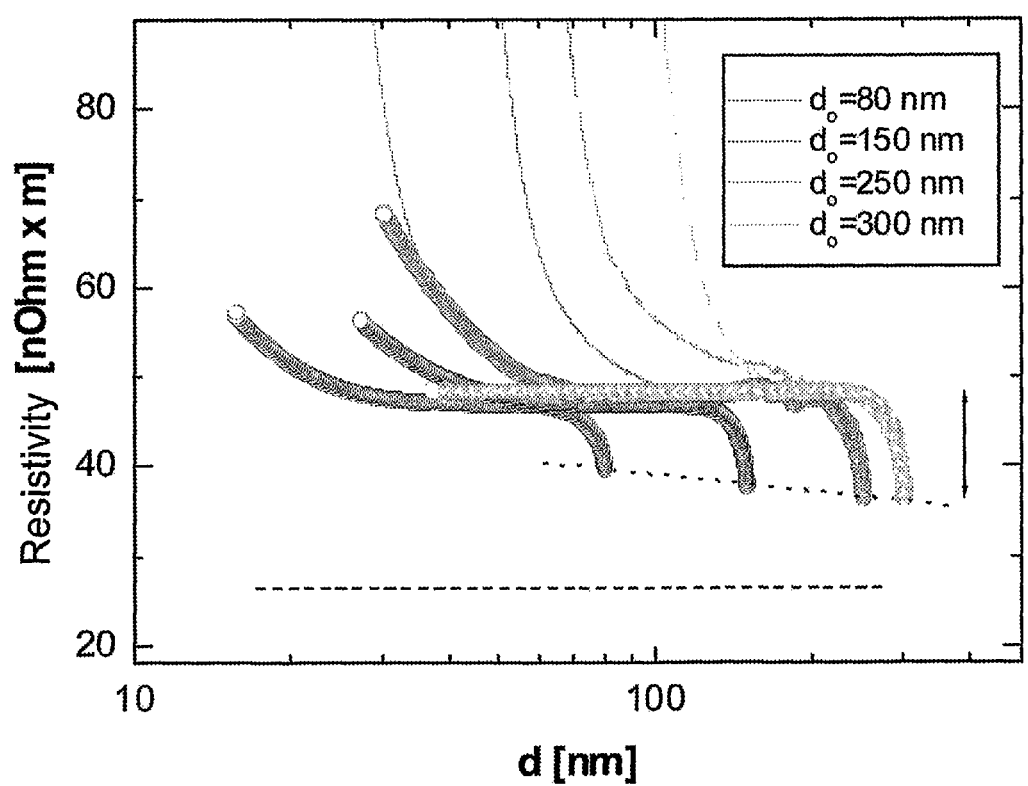
FIG. 15 shows a graph depicting the resistivity of arrays of Au nanowires produced by IBS technique from films having a different initial thickness, as a function of the sputtering time. It also illustrates the resistivity in the parallel direction to the nanowires and perpendicular thereto.

The layer resistance values can be converted in the film resistivity, when the film initial thickness is known. Said conversion is depicted in FIG. 15, and allows comparing films having a different initial thickness. The data indicate that, given an initial thickness, for an increasing erosion time (thus, reduction of film thickness), the layer resistance increases, with the expected trend $1/d$ (after an initial transient, during which the film temperature increases due to the ion irradiation), where d is the film thickness. For films having high thicknesses, no anisotropy of the resistance is observed, but when the film residual thickness becomes comparable to the electron mean free path for Au at room temperature (about 40 nm), the surface scattering of the electrons at the corrugated interface with the vacuum becomes more and more important (thus opening a new scattering channel); at even higher ion doses, the film breaks up into locally disconnected nanowires (a regimen in which the electrical conductivity becomes dominated by percolation) and the resistivity markedly increases.

At this point, the parallel resistivity and the perpendicular resistivity markedly differentiate. The resistivity in the parallel direction to the nanowires remains approximately unvaried, while the resistivity in the direction perpendicular to the nanowires increases by two orders of magnitude (further increasing, if ion irradiation is continued—data not shown). Said behaviour is due to the formation of the array of metal nanowires disconnected in the transversal direction. Therefore, it is possible to easily achieve a good electrical conductivity on macroscopic distances (of the order of cms) in the parallel direction to the nanowires, while, with the disconnection of the nanowires, the conductivity in the transversal direction is drastically reduced.

Figure 16:
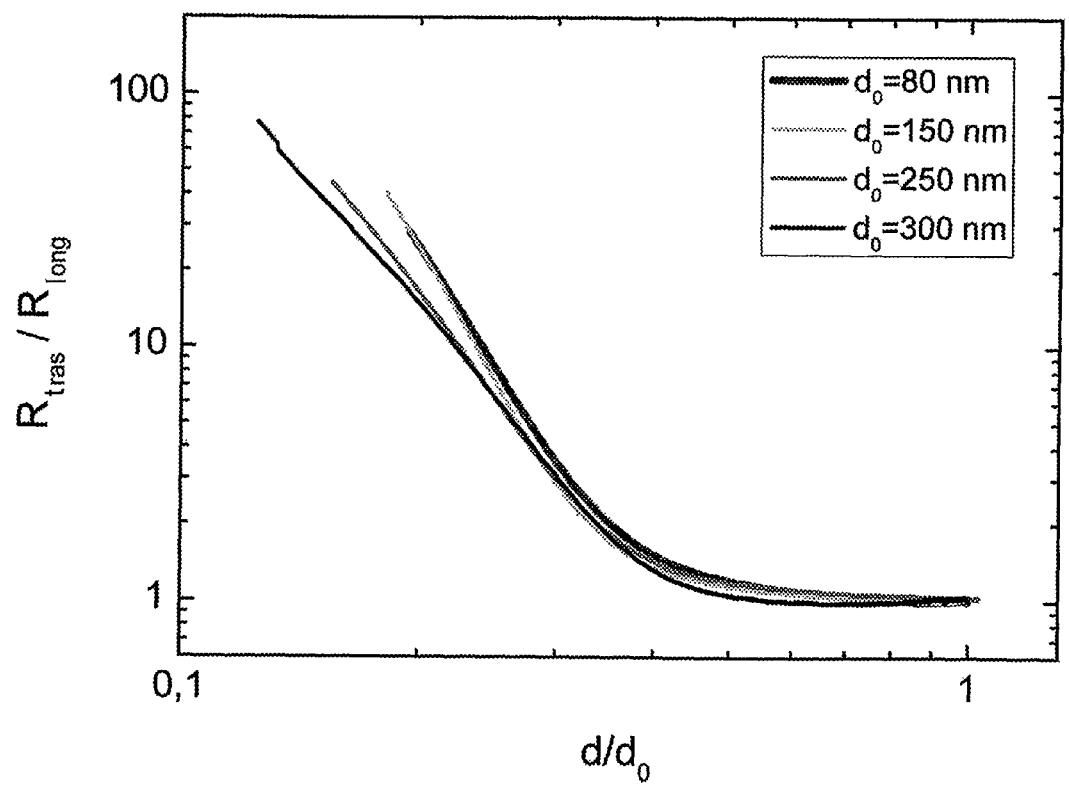
FIG. 16 shows a graph illustrating the ratio between transverse layer resistance and longitudinal layer resistance of arrays of Au nanowires produced by IBS technique from films having a different initial thickness $d_0$, as a function of the ratio $d/d_0$, where d is the film residual thickness which, as a function of the sputtering time t, decreases according to a law $d=d_0(1-\alpha t)$, where α is the erosion rate of the Au film (in the examples shown, α≈0.022 nm/sec). The data relative to the film for which both the longitudinal and the transverse layer resistances have been acquired as a function of the erosion time are reported in the graph.

FIG. 16 illustrates a graph showing the ratio between the transversal and longitudinal layer resistances for arrays of Au nanowires produced by IBS technique from films having a different initial thickness $d_0$, as a function of the ratio $d/d_0$, where d is the film residual thickness. The latter, as a function of the sputtering time t, decreases according to the law $d=d_0(1-\alpha t)$, where a illustrates the Au film erosion rate (in the examples illustrated, α≈0.022 nm/sec). In the graph, the data relative to the films for which both the longitudinal and the transversal layer resistances were acquired as a function of the erosion time are reported. It is important to notice that by reporting the data in this manners, it is obtained that for films having different thicknesses, the ratio between the resistances (or, equivalently, the resistivities) tends to scale homogeneously.

Figure 17:
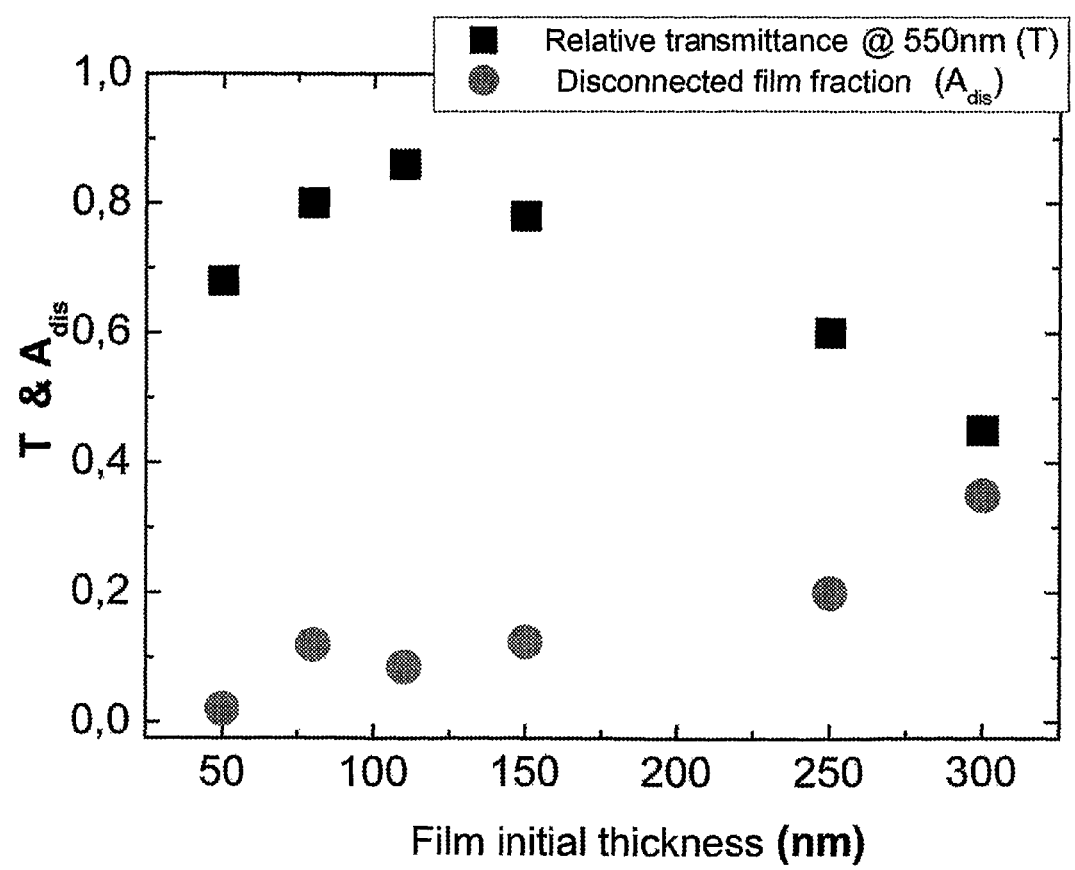
FIG. 17 shows a graph depicting the optical transmittance (T) at a 550 nm wavelength for arrays of Au nanowires produced by IBS technique from films having a different initial thickness, but with equal transverse layer resistance of 100 Ohm (arrays of nanowires in FIG. 9a-14a). The datum for the film with a 300 nm thickness is extrapolated by knowing the area of the disconnected metal film, and the film thickness. It also illustrates the area fraction ($A_{dis}$) of the metal film surface taken up by the disconnected regions.

FIG. 17 illustrates a graph showing the optical transmittance (T) at a 550 nm wavelength for arrays of Au nanowires produced by IBS technique from films having a different initial thickness, but with equal transverse layer resistance of 100 Ohm (array of nanowires in FIGS. 9a-14a). The datum for the film of 300 nm thickness is extrapolated by knowing the area of the disconnected metal film, and the film thickness. It also illustrates the area fraction ($A_{dis}$) of the metal film surface taken up by the disconnected regions.

Figure 18:
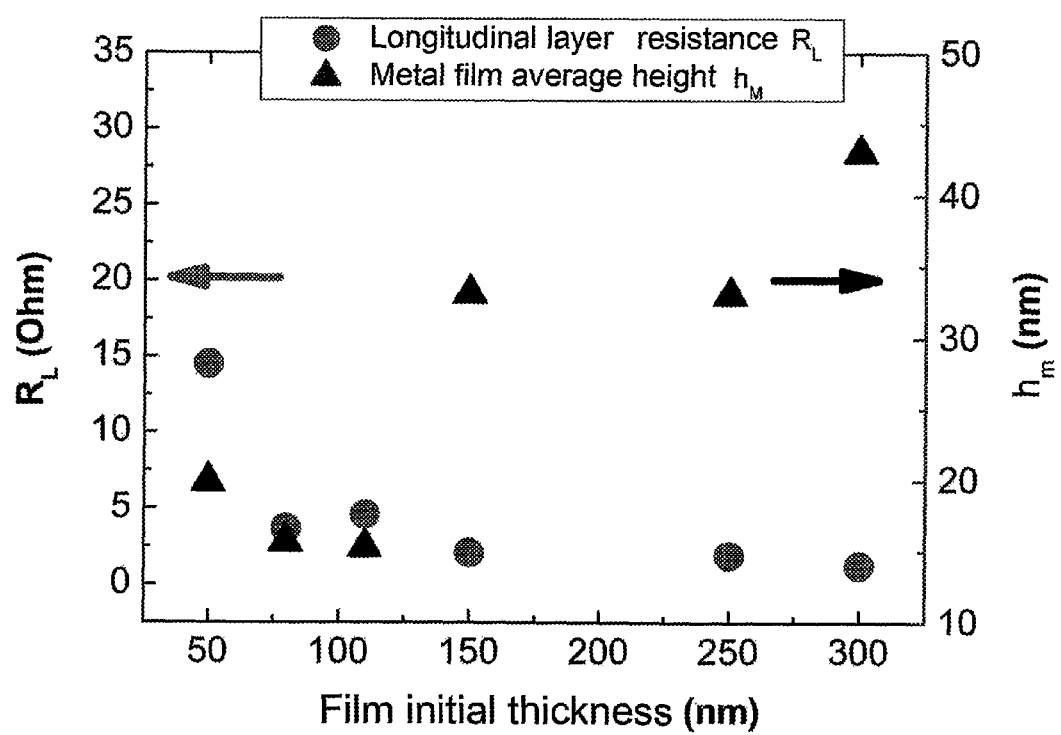
FIG. 18 illustrates the value of the longitudinal layer resistance $R_L$ of the arrays of nanowires obtained starting from different initial thicknesses for the film reported in FIG. 9a-14a. Also the average height of the residual Au film obtained from the histograms is reported.

FIG. 18 illustrates the value of the longitudinal layer resistance $R_L$ of the arrays of nanowires obtained starting from different initial thicknesses for the film reported in FIGS. 9a-14a. The average height of the residual Au film obtained from the histograms is also reported.

An important element characterizing the electrical conductivity over macroscopic distances (scale of the centimeter) in the longitudinal direction of the nanowires is given by the longitudinal interconnection of the nanowires also in the presence of a finite length thereof (scale of tens of micrometers). Therefore, the growth of nanowires with a longer average length (through a reduction of the substrate roughness and the improvement of the epitaxial properties of the metal film) results in a reduction of the longitudinal layer resistance.

Furthermore, it shall be appreciated that with a very low initial thickness, i.e., $d_0 \leq 110$ nm, it is still possible to achieve, also starting from a polycrystalline metallic layer, a significantly lower layer resistance compared to those which can be achieved with the traditional conductive oxides, while ensuring a transmittance which is about or above 80%. Furthermore, the limitation of the deposited metallic material thickness allows reducing the material consumptions, while having an optimal performance both from an optical and conductive point of view. A further improvement of the device performance could be obtained by improving the epitaxial property of the metal film; a higher dimension of the polycrystalline grains would allow decreasing the grain boundary scattering, and concomitantly a higher planarity of the film would allow promoting the growth of metal nanowires with maximum elongation. However, it shall be noticed that, in the experimental conditions used, with an initial thickness $d_0$ between about 80 nm and about 110 nm, the best compromise between high optical transmittance, low longitudinal layer resistance, low precious metal consumption, reduced processing time is obtained.

In fact, a further reduction of the film initial thickness (in the examples shown, up to 50 nm) does not allow a further improvement of the device performance (see FIGS. 17 and 18). In fact, it shall be noticed that as the film residual thickness decreases, a less marked anisotropy in the longitudinal layer resistance results. In his case, at a $R_T$=100 Ohm, the resistance $R_L$ assumes a value of about 30 Ohm. Furthermore, it shall be appreciated that the reduction of $d_0$ at 50 nm does not allow further increasing the optical transmittance relative to the case of 80 nm, since the area of the disconnected film regions undergoes a strong reduction. This is due to the reduction of the irradiation time, and the consequent lower morphological anisotropy of the nanowires, which build a lower peak-valley corrugation and a lower disconnection rate. A further consequence thereof is observed in the transmittance spectra of the polarized light having a smaller dichroic contrast. In any case, it is expected that the lower thickness limit which can be reached according to the present invention cannot be lower than the mean free path of the electrons in the material of the metallic layer; for lower thicknesses, in fact, the metal film resistivity becomes dominated by the electron-surface scattering contribution, which contribution increases in inverse proportion to the film thickness.

The above cited results were obtained for Au films by way of example only. For films obtained from materials with a resistivity ρ other than the resistivity $\rho^{Au}$ of the Au films, since the layer resistance $R_{sq}$ results to be $R_{sq}=\rho/d$ for a film having a thickness d, the starting thicknesses $d_0$ shall be suitably rescaled according to the following relationship: $d_0=d_0^{Au} \cdot (\rho/\rho^{Au})$. Therefore, this relationship allows defining the condition for the starting thickness of the film $d_0$ as $d_0 \leq d_0^{Au} \cdot (\rho/\rho^{Au})$, where $d_0^{Au}=110$ nm, which allows obtaining the same longitudinal layer resistance after the process of nanostructuration by IBS, for a similar morphology of the nanowire array. Under these hypotheses, a ratio of the longitudinal and transversal layer resistances which is similar to the one found for Au is also obtained.

As it shall be appreciated, according to the invention, a method for the production of a photonic device is provided which allows to have a laterally ordered array of conductors (metal nanowires) supported on low cost transparent dielectric substrates (glass or polymeric films) grown in a self-organized manner and on large areas. Said method is particularly adapted to an application to thin-film photovoltaic devices or OLED devices.

In said context, the arrays of nanowires obtained with the proposed method produce a multiple effect:

(1) in the direction parallel to the nanowires, they provide a low layer resistance (a few Ohms, measured with electrodes arranged at a macroscopic distance of about 5 mm). Consequently, the arrays of nanowires represent a promising solution to eliminate the conductive oxides in the thin-film photovoltaic devices. In fact, the transparent conductive oxide layers have higher layer resistances of a factor of about 10-100 [Transparent Conducting Oxides for Photovoltaics, E. Fortunato, D. Ginley, H. Hosono and C. Paine, MRS Bulletin 32 (3) 242 (2007)], have higher optical transmission losses, and require a complex sequence of growth stages, involving high temperature thermal treatments, generally incompatible with many of the materials used in the thin-film photovoltaic devices;

(2) without any additional manufacturing steps, the array of nanowires is capable of supporting localized plasmon resonances with an adjustable spectral peak which is adapted to the solar spectrum;

(3) with the disconnection of the nanowires, the metal film optical transmittance can reach 70-90%, thus ensuring an effective light transmission to the active layers of the photovoltaic device. The reduction of the metal film initial thickness to lower values (equal or less than 110 nm for Au), results in an increase of the optical transmittance and in a more marked dichroic contrast, due to the excitation of localized plasmons when the metal film decays in an array of disconnected nanowires.

Of course, the principle of the invention being the same, the implementation details and the embodiments will be able to be widely changed compared to what has been described and illustrated by way of example only, without thereby departing from the scope of the present invention as defined by the annexed claims.

The invention claimed is:

1. A method for synthesizing an array of metal nanowires adapted to support localized plasmon resonances, comprising the following steps:
   a) arranging a planar substrate of dielectric material;
   b) depositing a polycrystalline metal film on the substrate; and
   c) irradiating the metal film with a defocused beam of noble gas ions under high vacuum, including:
   c1) producing a corrugation on a metal film surface, formed by a plurality of mutually parallel nanoscale self-organized corrugations;
   c2) subsequently increasing accumulated ion doses and increasing a height of peaks of the self-organized corrugations relative to valleys interposed therebetween;
   c3) then further increasing the accumulated ion doses and eroding the polycrystalline metal film and exposing the substrate at the valleys and mutually disconnecting the self-organized corrugations, generating said array of metal nanowires; and
   c4) further increasing the accumulated ion doses and reducing the cross-section by reducing a longitudinal width of nanowires of the array of nanowires in a controlled manner, and adjusting a position of the localized plasmon resonances which can be associated thereto to lower wavelengths,
   wherein, during ion irradiating, the polycrystalline metal film and substrate temperature is controlled and kept below a level of decaying of the self-organized corrugations or nanowires by diffusive relaxation.

2. The method according to claim 1, wherein the dielectric material of the substrate is transparent to the wavelength of the localized plasmon resonances.

3. The method according to claim 2, wherein the dielectric material of the substrate is a glass.

4. The method according to claim 1, wherein the dielectric material of the substrate is a polymer.

5. The method according to claim 4, wherein, during ion irradiation, maintaining the metal film and substrate temperature below a value that is the smallest between:
   i) a glass transition temperature $T_g$ of the polymer, and
   ii) a temperature preventing the self-organized corrugations or nanowires from decaying by diffusive relaxation.

6. The method according to claim 1, wherein an ion beam incidence angle relative to the perpendicular to the metal film surface is such that the self-organized corrugations arrange, according to a plane view, parallel to an ion beam direction.

7. The method according to claim 1, wherein, at the end of the step b), the polycrystalline metal film has a thickness being selected according to grain dimensions and the polycrystalline metal film roughness, so as to allow step c2).

8. The method according to claim 1, wherein the polycrystalline metal film has a thickness $d_0 \leq d_0^{Au} \cdot (\rho/\rho^{Au})$, where $d_0^{Au} = 110$ nm, $\rho$ is the resistivity of a film metallic material, and $\rho^{Au}$ is the Au resistivity.

9. The method according to claim 8, wherein the polycrystalline metal film thickness $d_0$ is adjusted and, while keeping a transverse layer resistance of the array of nanowires constant, the nanowires and valleys width and section is adjusted, and a longitudinal layer resistance of the nanowires array is accordingly adjusted.

10. The method according to claim 8, wherein the thickness $d_0$ of the polycrystalline metal film is adjusted and, while keeping a transverse layer resistance of the array of nanowires constant, an optical transparency of said array of nanowires is altered, without altering a plasmon spectral response thereof.

11. A method synthesizing an array of metal nanowires adapted to support localized plasmon resonances, comprising the following steps:
   a) arranging a planar substrate of dielectric material;
   b) depositing a polycrystalline metal film on the planar substrate; and
   c) irradiating the polycrystalline metal film with a defocused beam of noble gas ions under high vacuum, including:
   c1) producing a corrugation on a surface of the polycrystalline metal film formed by a plurality of mutually parallel nanoscale self-organized corrugations;
   c2) subsequently increasing accumulated ion doses and increasing a height of a peaks of the self-organized corrugations relative to valleys interposed therebetween;
   c3) then further increasing the accumulated ion doses and eroding the polycrystalline metal film and exposing the planar substrate at the valleys and mutually disconnecting the self-organized corrugations, generating said array of metal nanowires;
   c4) further increasing the accumulated ion doses and reducing the cross-section by reducing a longitudinal width of nanowires of the array of nanowires in a controlled manner, and adjusting a position of the localized plasmon resonances which can be associated thereto to lower wavelengths, and
   wherein, during ion irradiating, the polycrystalline metal film and the planar substrate temperature are controlled and kept below a level of decaying of the self-organized corrugations or nanowires by diffusive relaxation.

* * * * *